United States Patent
Ji et al.

(10) Patent No.: US 12,142,811 B2
(45) Date of Patent: Nov. 12, 2024

(54) ANTENNA DEVICE

(71) Applicant: KMW INC., Hwaseong-si (KR)

(72) Inventors: Kyo Sung Ji, Hwaseong-si (KR); Hye Yeon Kim, Hwaseong-si (KR); Youn Jun Cho, Hwaseong-si (KR)

(73) Assignee: KMW INC., Hwaseong-si (KR)

( * ) Notice: Subject to any disclaimer, the term of this patent is extended or adjusted under 35 U.S.C. 154(b) by 322 days.

(21) Appl. No.: 17/693,259

(22) Filed: Mar. 11, 2022

(65) Prior Publication Data
US 2022/0200125 A1 Jun. 23, 2022

Related U.S. Application Data

(63) Continuation of application No. PCT/KR2020/012602, filed on Sep. 18, 2020.

(30) Foreign Application Priority Data

Sep. 19, 2019 (KR) .................. 10-2019-0115590
Sep. 17, 2020 (KR) .................. 10-2020-0120021

(51) Int. Cl.
*H01Q 1/02* (2006.01)
*F28D 15/02* (2006.01)
(Continued)

(52) U.S. Cl.
CPC .......... *H01Q 1/02* (2013.01); *F28D 15/0233* (2013.01); *F28F 3/12* (2013.01); *H01Q 1/2283* (2013.01); *F28D 2021/0029* (2013.01)

(58) Field of Classification Search
CPC .... H01Q 1/02; H01Q 1/2283; F28D 15/0233; F28D 2021/0029; F28F 3/12
See application file for complete search history.

(56) References Cited

U.S. PATENT DOCUMENTS

| | | | |
|---|---|---|---|
| 5,732,765 A | 3/1998 | Drolen et al. | |
| 7,043,280 B1 * | 5/2006 | Shields | H01Q 1/246 343/702 |

(Continued)

FOREIGN PATENT DOCUMENTS

| | | |
|---|---|---|
| CN | 109906025 A | 6/2019 |
| JP | 2017-046121 A | 11/2004 |

(Continued)

OTHER PUBLICATIONS

International Search Report mailed Dec. 24, 2020 for International Application No. PCT/KR2020/012602 and its English translation.
(Continued)

*Primary Examiner* — Tho V Duong
(74) *Attorney, Agent, or Firm* — Insight Law Group, PLLC; Seung Lee

(57) ABSTRACT

An antenna device may include: a main housing configured to house and fix a first board having a plurality of heating elements mounted on a rear surface thereof; at least one U-shaped heat dissipation cluster detachably coupled to the rear surface of the main housing, and filled with a predetermined refrigerant, wherein the refrigerant receives heat from the heating elements and dissipates the heat to the outside while moving along a pattern flow path formed in a distributed manner toward the outside; and at least one heat-collection mediating fixing part configured to collect heat from the heating elements and transfer the collected heat to the U-shaped heat dissipation cluster, while mediating the attachment/detachment of the U-shaped heat dissipation cluster to/from the rear surface of the main housing.

9 Claims, 18 Drawing Sheets

(51) Int. Cl.
    *F28F 3/12*     (2006.01)
    *H01Q 1/22*     (2006.01)
    *F28D 21/00*     (2006.01)

(56) References Cited

U.S. PATENT DOCUMENTS

| | | | |
|---|---|---|---|
| 8,593,369 B2* | 11/2013 | Storz | H01Q 25/04 343/878 |
| 9,107,326 B2 | 8/2015 | MacManus et al. | |
| 2004/0218362 A1 | 11/2004 | Amaro | |
| 2011/0075377 A1* | 3/2011 | Paquette | H05K 7/20509 165/185 |
| 2011/0188205 A1* | 8/2011 | MacManus | H05K 7/20 361/703 |
| 2013/0222201 A1* | 8/2013 | Ma | H01Q 1/246 343/834 |

FOREIGN PATENT DOCUMENTS

| | | |
|---|---|---|
| JP | 2009-099753 A | 5/2009 |
| JP | 2015-528214 A | 9/2015 |
| JP | 2017-502555 A | 1/2017 |
| JP | 2018-073912 A | 5/2018 |
| KR | 10-2019-0068486 A | 6/2019 |
| KR | 2019-0065816 A | 6/2019 |

OTHER PUBLICATIONS

Notice of Allowance mailed Apr. 4, 2023 from the Japanese Patent Office for Japanese Application No. 2022-515838.
Extended European Search Report mailed on Sep. 22, 2023 from the European Patent Office for European Application No. 20865270.1.

* cited by examiner

ANTENNA DEVICE

CROSS-REFERENCE TO RELATED APPLICATIONS

This application is a Continuation of International Application No. PCT/KR2020/012602, filed on Sep. 18, 2020, which claims the benefit of and priority to Korean Patent Application Nos. 10-2019-0115590, filed on Sep. 19, 2019; and 10-2020-0120021, filed on Sep. 17, 2020, the disclosure of which are herein incorporated by reference in their entirety.

TECHNICAL FIELD

The present disclosure relates to an antenna device, and more particularly, to an antenna device which can effectively suppress thermal concentration due to the formation of an ascending air current of heat generated from heating elements, and induce the heat from the heat source to rapidly dissipate to the rear.

BACKGROUND ART

MIMO (Multiple-Input Multiple-Output) which is one of wireless communication technologies is a technology for significantly increasing a data transmission capacity by using a plurality of antennas. Specifically, the MIMO is a spatial multiplexing technique in which a transmitter transmits different data through the respective transmitting antennas and a receiver identifies the transmitted data through proper signal processing.

Therefore, by increasing the numbers of transmitting antennas and receiving antennas at the same time, it is possible to improve the channel capacity such that a larger volume of data can be transmitted. For example, when the number of antennas is increased to 10, it is possible to secure a channel capacity ten times larger than that of a current single antenna system, while using the same frequency band. In the case of a transmitter/receiver device to which such a MIMO technology is applied, the numbers of transmitters and filters are also increased with the increase in the number of antennas.

As the numbers of transmitters and filters are increased, the number of heating elements is also increased. For the MIMO technology, research is precedently conducted on a heat dissipation structure for effectively dissipating heat generated from a plurality of heating elements, in order to prevent the degradation in performance of the antenna device.

The conventional antenna device has problems in that the number of parts is increased, and a plurality of heating elements are vertically elongated and arranged to avoid the interference between parts. Thus, the entire exterior of the antenna device is also vertically elongated, and heats generated from the heating elements disposed at the bottom of the antenna device are concentrated on the top thereof, thereby making it difficult for the antenna device to maintain uniform antenna performance.

DISCLOSURE

Technical Problem

Various embodiments are directed to an antenna device with enhanced heat dissipation performance.

Also, various embodiments are directed to an antenna device which includes independent U-shaped heat dissipation clusters and intermediate heat dissipation clusters, corresponding to heat dissipations of heating elements having the same specification, and can effectively suppress heat concentration caused by an ascending air current of heat.

Also, various embodiments are directed to an antenna device which can raise the performance of heat dissipation through the rear surface of a main housing, thereby preventing the degradation in performance in heating elements.

The technical problems of the present disclosure are not limited to the above-described problems, and other technical problems which are not described will be clearly understood by those skilled in the art, based on the following descriptions.

Technical Solution

In an embodiment, an antenna device may include: a main housing configured to house and fix a first board having a plurality of heating elements mounted on a rear surface thereof; at least one U-shaped heat dissipation cluster detachably coupled to the rear surface of the main housing, and filled with a predetermined refrigerant, wherein the refrigerant receives heat from the heating elements and dissipates the heat to the outside while moving along a pattern flow path formed in a distributed manner toward the outside; and at least one heat-collection mediating fixing part configured to collect heat from the heating elements and transfer the collected heat to the U-shaped heat dissipation cluster, while mediating the attachment/detachment of the U-shaped heat dissipation cluster to/from the rear surface of the main housing.

The U-shaped heat dissipation cluster may include: a lower heat dissipation part provided at the bottom of the rear surface of the main housing; and an upper heat dissipation part provided at the top of the rear surface of the main housing.

The plurality of heating elements may include first heating elements and second heating elements. The first heating element may be a PA (Power Amplifier) element, and the second heating element may be a semiconductor element for RFIC or an LNA (Low Noise Amplifier) element.

The antenna device may further include an intermediate heat dissipation cluster configured to dissipate heat generated from a plurality of third heating elements mounted on a region of the rear surface of the first board, the region corresponding to the space between the lower heat dissipation part and the upper heat dissipation part.

The intermediate heat dissipation cluster may include: a heat collection part installed at a heating portion of the third heating element and configured to absorb and collect heat from the third heating element; and a heat transfer part provided as a heat pipe having one end brought into thermal contact with the heat collection part and the other end brought into thermal contact with a mounting heat dissipation part provided on the rear side of the main housing.

The plurality of third heating elements may have a higher heating value than the plurality of heating elements.

The U-shaped heat dissipation cluster nay include: an inner heat dissipation plate bent to have a U-shaped cross-section, and having the pattern flow path engraved therein such that the pattern flow path is filled with the refrigerant; and an outer heat dissipation plate bent to have a U-shaped cross-section, and joined to the outside of the inner heat dissipation plate.

The inner heat dissipation plate and the outer heat dissipation plate may be closely joined to each other such that the refrigerant stored in the pattern flow path does not leak.

The pattern flow path may include: a heat receiving pattern part provided at a connection portion of the U-shaped cross-section, and configured to receive heat from the heat-collection mediating fixing part; and a heat dissipation pattern part communicating with the heat receiving pattern part, and formed at either end of the U-shaped cross-section so as to dissipate the heat transferred from the heat receiving pattern part.

The heat receiving pattern part may be formed as a plurality of straight lines to connect the heat dissipation pattern parts formed at both ends of the U-shaped cross-section, respectively, and the heat dissipation pattern part may communicate with the front ends of the plurality of heat receiving pattern parts formed as the plurality of straight lines, and has a heat dissipation area that increases toward the outside.

The heat dissipation pattern part may include: a joining surface formed in a circular or polygonal shape such that the inner heat dissipation plate and the outer heat dissipation plate are joined to each other through the joining surface; and a refrigerant flow path formed so that the inner heat dissipation plate and the outer heat dissipation plate are spaced apart from each other along the refrigerant flow path, and the refrigerant flows between the joining surfaces or outside the joining surfaces.

The heat-collection mediating fixing part may have a U-shaped mating groove to seat a portion of the heat receiving pattern part.

The U-shaped heat dissipation cluster may include a plurality of unit heat dissipation bodies having a U-shaped cross-section with a height and gaps provided to remove thermal interference therebetween.

Advantageous Effects

In accordance with the embodiment of the present disclosure, the antenna device can effectively dissipate heat through the U-shaped heat dissipation clusters and the intermediate heat dissipation clusters, which are independently provided for the respective heating elements, and minimize heat concentration by an ascending air current of heat on the rear surface of the main housing which is elongated in the top-to-bottom direction, thereby preventing the degradation in performance of parts.

MODE FOR INVENTION

Figure 1A:
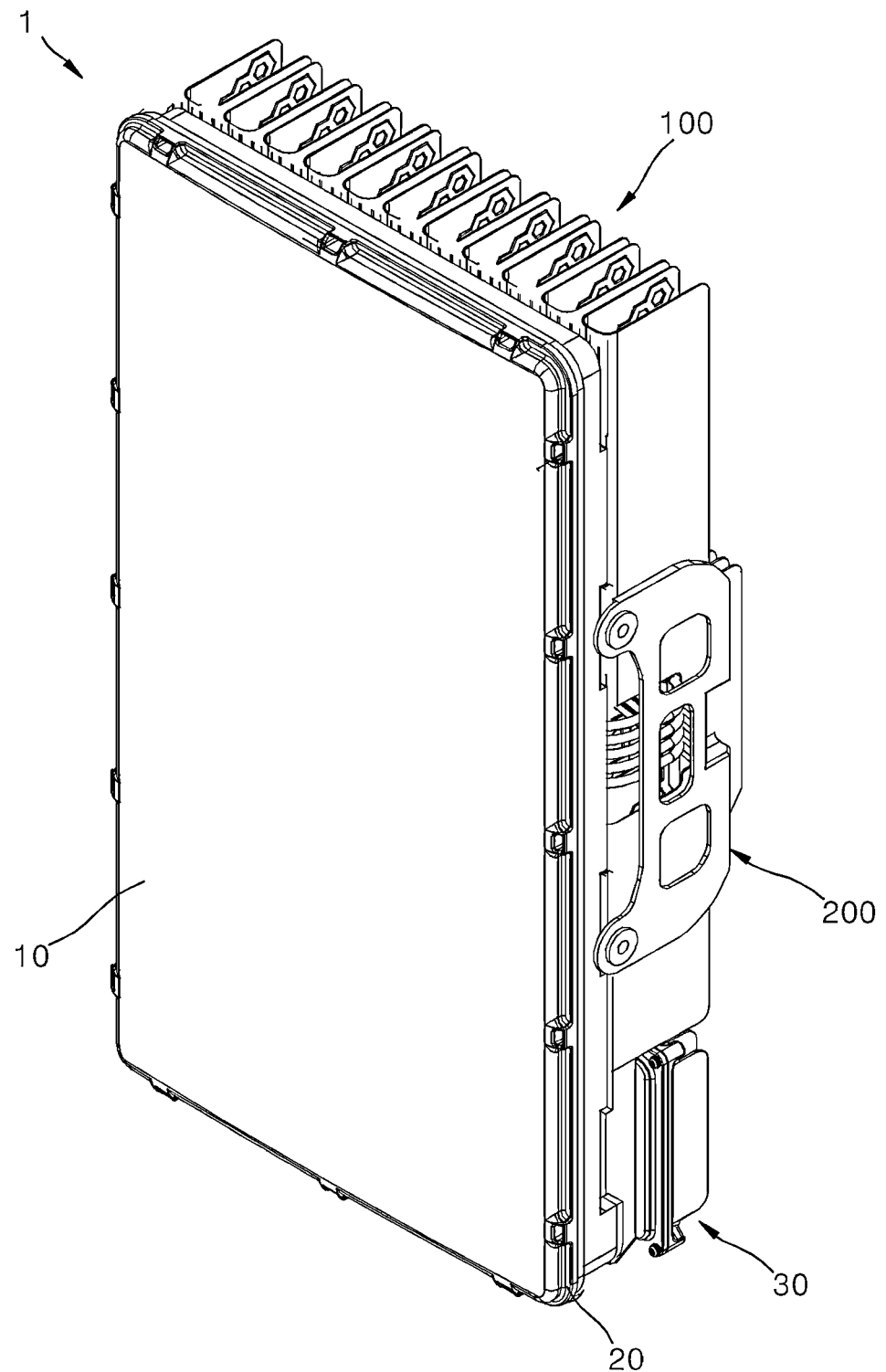
FIGS. 1A and 1B are perspective views illustrating the front and rear exteriors of an antenna device in accordance with an embodiment of the present disclosure.

Hereafter, an antenna device of an embodiment of the present disclosure will be described in detail with reference to the accompanying drawings.

It should be understood that, when reference numerals are attached to components of the drawings, the same components are represented by like reference numerals even though the same components are illustrated in different drawings. Moreover, in describing embodiments of the present disclosure, detailed descriptions for related publicly-known configurations or functions will be ruled out in order not to unnecessarily obscure subject matters of the present invention.

While a component of the embodiment of the present disclosure are described, a term such as first, second, A, B, (a), or (b) may be used. Such a term is only used to distinguish the corresponding element from another element, and the nature of the corresponding element or the order or sequence thereof is not limited by the term. Furthermore, all terms used herein, which include technical or scientific terms, have the same meanings as those generally understood by those skilled in the art to which the present disclosure pertains, as long as the terms are differently defined. The terms defined in a generally used dictionary should be analyzed to have meanings which coincide with contextual meanings in the related art. As long as the terms are not clearly defined in this specification, the terms are not analyzed as ideal or excessively formal meanings.

Figure 1B:
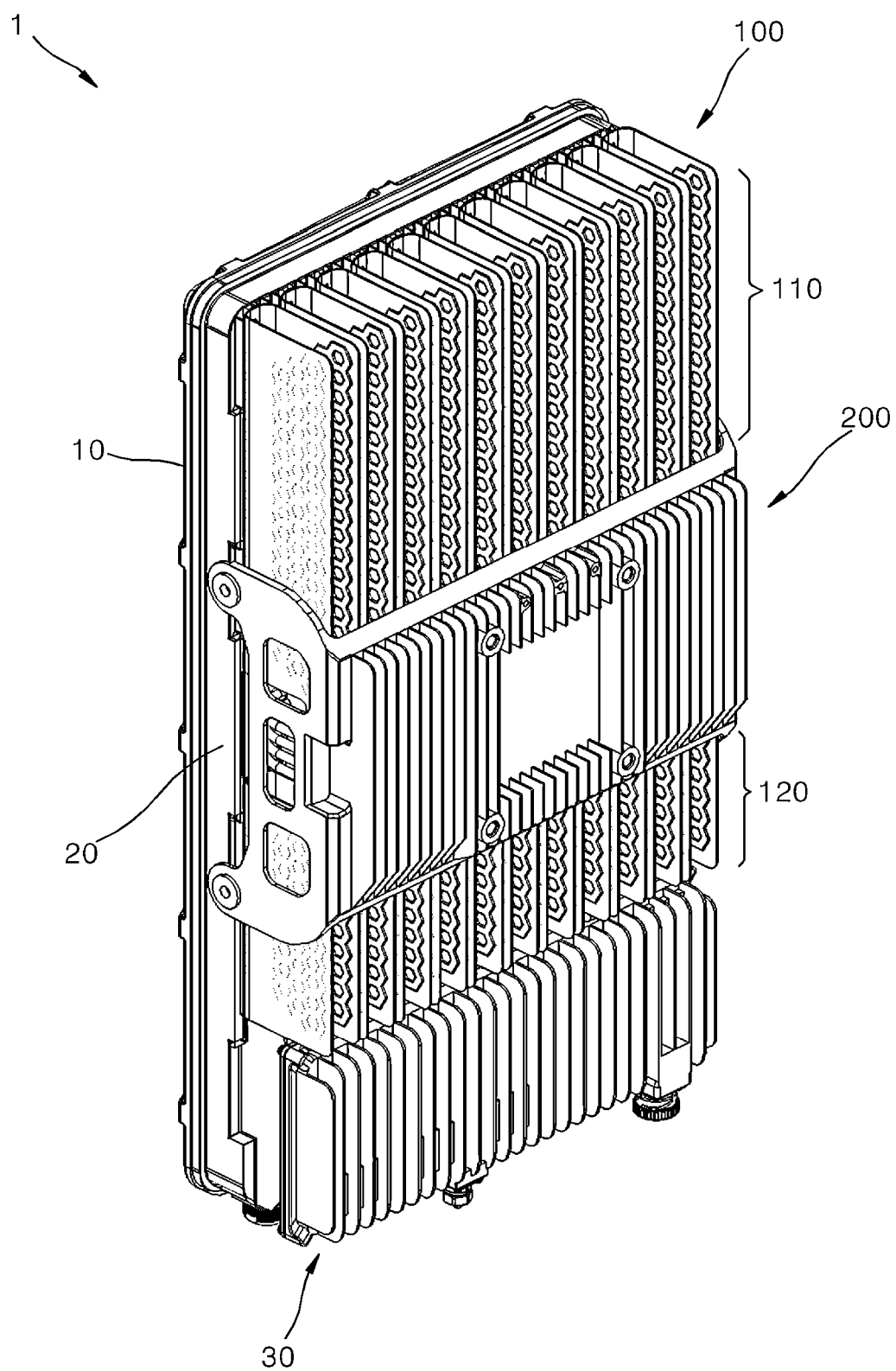
Figure 2:
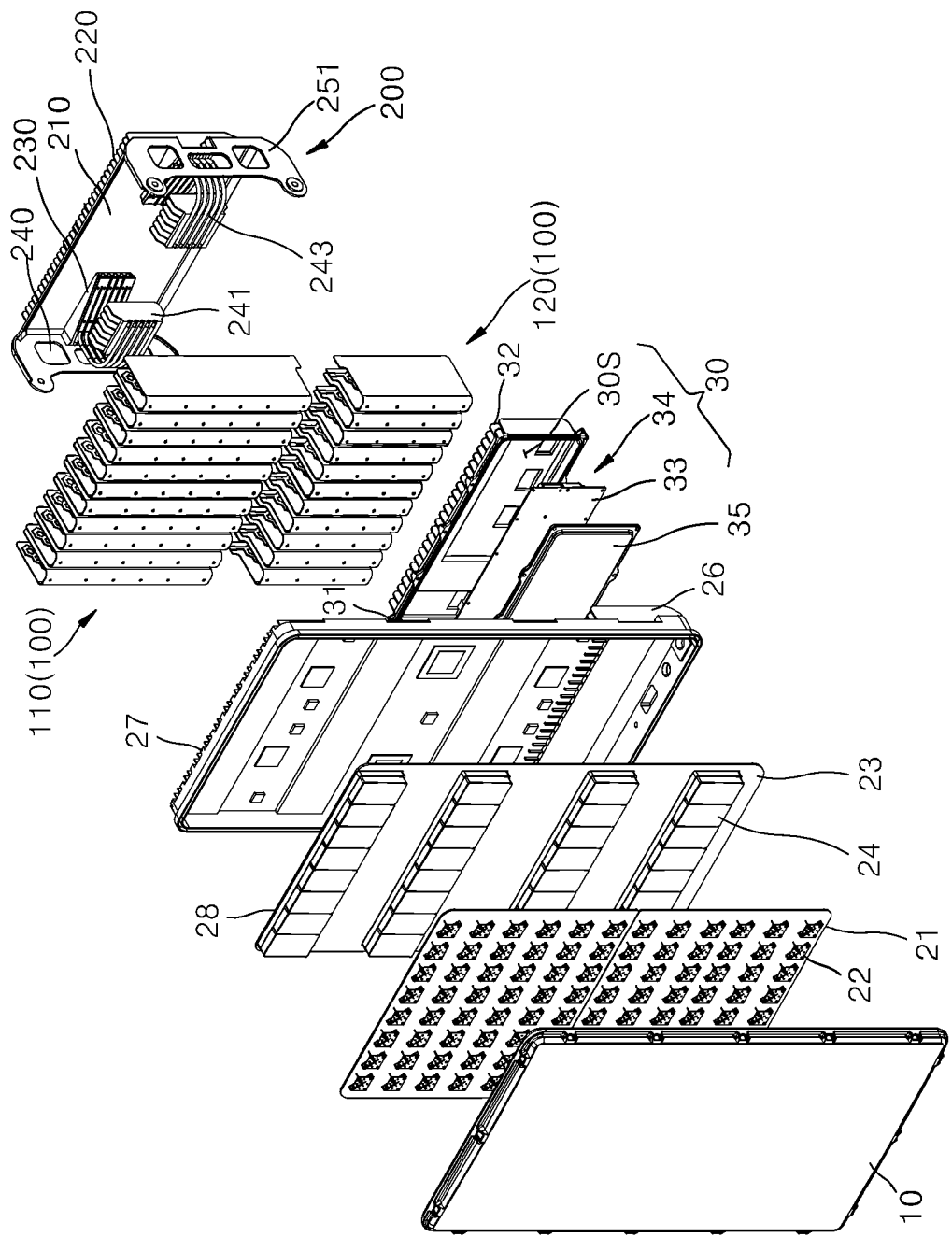
FIG. 2 is an exploded perspective view of FIG. 1A.
Figure 3:
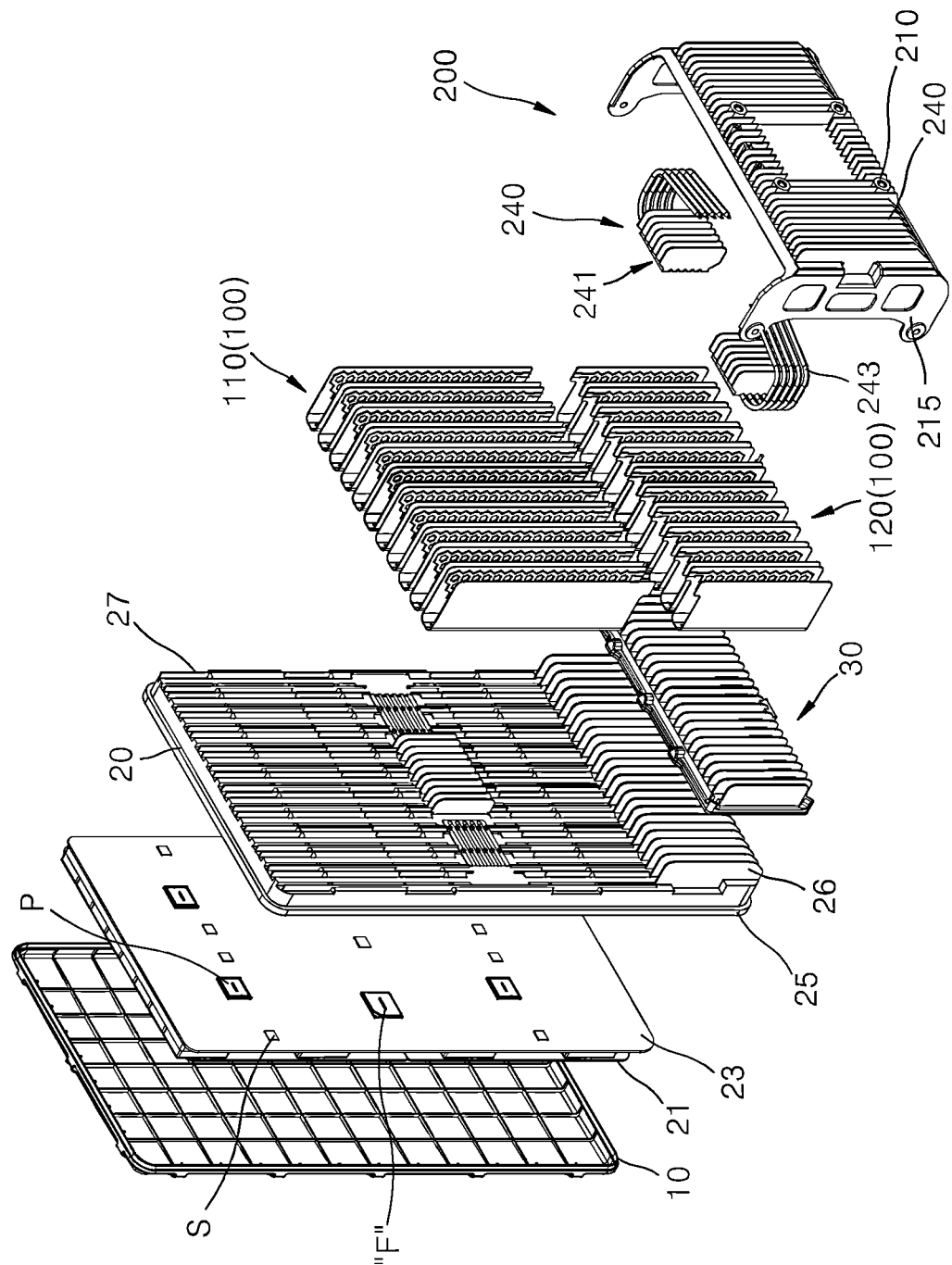
FIG. 3 is an exploded perspective view of FIG. 1B.
Figure 4:
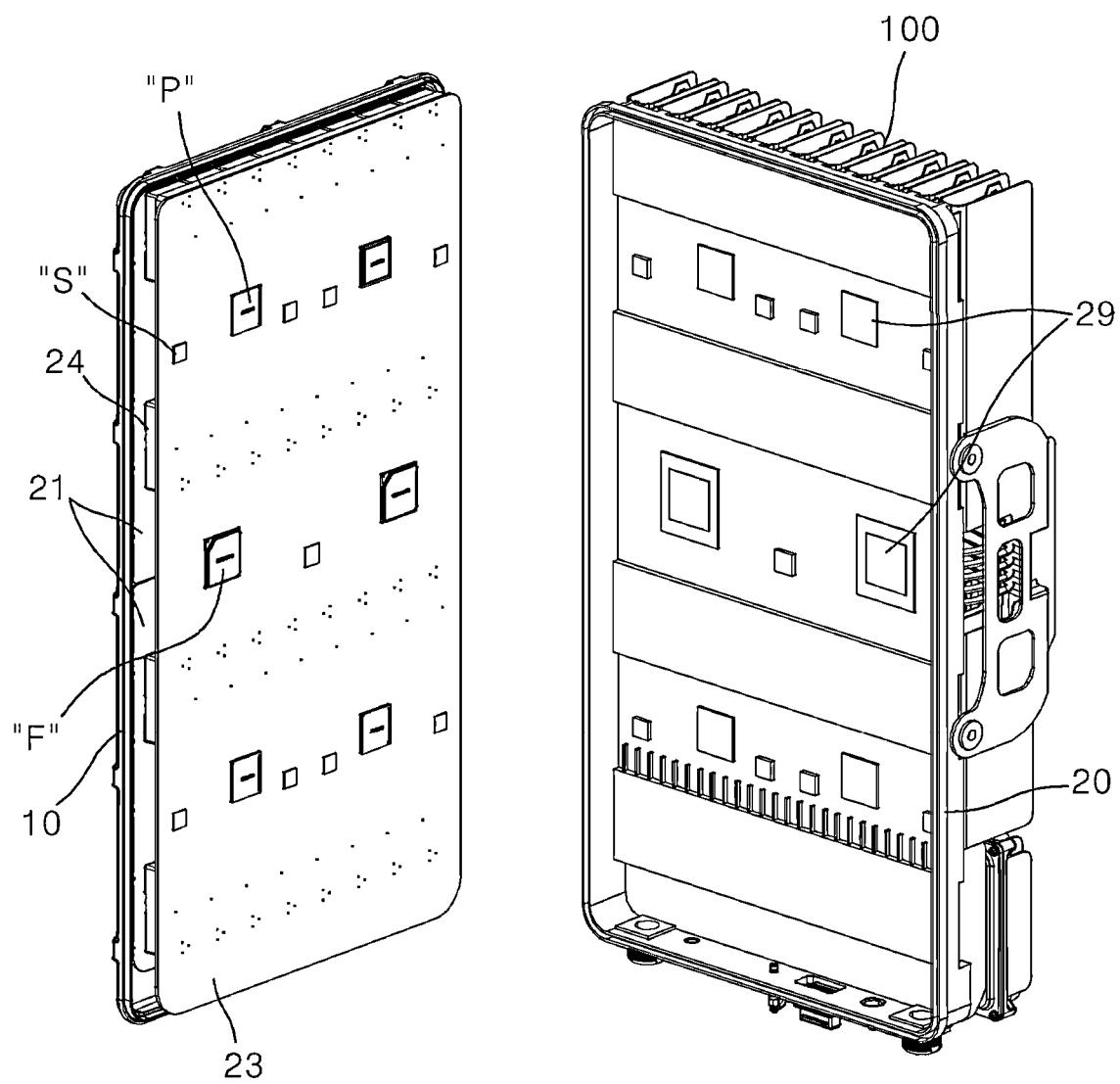
FIG. 4 is an exploded perspective view illustrating the coupling relationship between a main housing and a second board among components of FIG. 2.

FIGS. 1A and 1B are perspective views illustrating the front and rear exteriors of an antenna device in accordance with an embodiment of the present disclosure, FIG. 2 is an exploded perspective view of FIG. 1A, FIG. 3 is an exploded perspective view of FIG. 1B, and FIG. 4 is an exploded perspective view illustrating the coupling relationship between a main housing and a second board among components of FIG. 2.

As illustrated in FIGS. 1A to 3, an antenna device 1 in accordance with the embodiment of the present disclosure includes a main housing 20, a first board 23, and a second board 21. The main housing 20 has a housing space open to the front, and is formed in a rectangular parallelepiped shape which is elongated in a top-to-bottom direction and has a small front-to-rear housing width. The first board 23 is a board for a PAU (Power Amplifier Unit) and DTU (Digital Transceiving Unit) housed in the housing space of the main housing 20, and has a plurality of MBFs (Multi-Band Filters) mounted on the front surface thereof through a clamshell 28, and a plurality of first heating elements P, a plurality of second heating elements S, and a plurality of third heating elements F, which are mounted on the rear surface thereof. The second board 21 has a plurality of antenna elements 22 mounted thereon.

In general, the first board 23 may be referred to as a main board, and the second board 21 may be referred to as an antenna board. The first heating element P and the second heating element S have different output powers. The first heating element P may be a PA (Power Amplifier) element, and the second heating element S may be an LNA (Low Noise Amplifier) element or a semiconductor element for RFIC. The PA element serving as the first heating element P is a transistor which is a main heating part of a high-frequency power amplifier. The PA element is an RF (Radio Frequency) element with high output power, and has a larger heating value than the LNA element or the semiconductor element for RFIC, which serves as the second heating element S.

The first heating element P having a higher heating value than the second heating element S may be designed to be disposed closer to a thermal contact part 29 of the main housing 20, which will be described below, than the second heating element S. Thus, heat generated by the first heating element P may be easily transferred through direct surface thermal contact with the thermal contact part 29, and dissipated through a U-shaped heat dissipation cluster 100 installed on the rear side of the main housing 20.

The antenna device 1 in accordance with the present embodiment may further include a radome 10 configured to shield the housing space of the main housing 20, made of a material which transmits electromagnetic waves, and fixed to the front side of the main housing 20, and the U-shaped heat dissipation cluster 100 detachably provided on the rear side of the main housing 20 and configured to dissipate heat, generated from the first and second heating elements P and S, to the outside.

The antenna device 1 may further include a power supply including a PSU (Power Supply Unit) housing 31 which is provided separately from the first and second boards 23 and 21 and detachably installed on the rear side of the main housing 20. The PSU housing 31 may have a PSU board 33 and a plurality of PSU heat dissipation pins 32. The PSU board 33 may be embedded in the PSU housing 31, and include a plurality of PSUs 34 mounted thereon and configured to supply power to the above-described first to third heating elements P, S, and F, and the plurality of PSU dissipation pins 32 may be provided on the outside of the PSU housing 31 and configured to independently dissipate heats generated from the plurality of PSUs 34. The PSU housing 31 may further include a PSU cover 35 which defines the boundary with the main housing 20 while shielding the PSU housing space in which the PSU board 33 is embedded.

In a general antenna device, part elements such as the antenna elements 22, which serve to transmit/receive a signal outputted/inputted in the form of a frequency, are mounted on the front surface of the second board 21 located around the radome 10, and part elements such as the first to third heating elements P, S, and F and the PSUs 34, which generate heats, are typically mounted on the first board or mounted close to the first board 23, such that the heats are dissipated toward the rear side of the main housing 20. For this structure, a plurality of heat dissipation pins and the main housing 20 are formed as one body on the rear side of the main housing 20 constituting the rear exterior of the general antenna device.

Among the components of the antenna device 1 in accordance with the embodiment of the present disclosure, the U-shaped heat dissipation cluster 100 and an intermediate heat dissipation cluster 240 may be detachably provided on the main housing 20, unlike the plurality of heat dissipation pins of the above-described general antenna device. Therefore, the installation positions and shapes of the U-shaped heat dissipation cluster 100 and the intermediate heat dissipation cluster 240 may be designed in different manners depending on the positions and heating values of the first heating element P, the second heating element S, and the third heating element F, which are mounted on the second board 21. Thus, it is possible to maximize the heat dissipation performance of the antenna device.

More specifically, as illustrated in FIGS. 1A to 3, the antenna device 1 in accordance with the embodiment of the present disclosure includes: the main housing 20 that houses and fixes the first board 23 having the plurality of first heating elements P and the plurality of second heating elements S mounted on the rear surface thereof so as to be distributed apart from each other; and at least one U-shaped heat dissipation cluster 100 that is detachably coupled to the rear side of the main housing 20 and filled with a predetermined refrigerant which receives heat from the first and second heating elements P and S and dissipates the heat while moving to the outside along a pattern flow path 109 formed in a distributed manner toward the outside.

In the antenna device 1 in accordance with the embodiment of the present disclosure, the third heating elements F may be mounted and disposed at the middle of the rear surface of the first board 23, and the first heating elements P and the second heating elements S may be distributed and mounted at the top and bottom of the rear surface of the first board 23, with the third heating elements F interposed therebetween. Thus, the U-shaped heat dissipation cluster 100 may also be provided as two clusters at the top and bottom of the rear surface of the main housing 20. The intermediate heat dissipation cluster 240 to be described below may be located in the space between the U-shaped heat dissipation clusters 100 provided at the top and bottom of the rear surface of the main housing 20.

The U-shaped heat dissipation cluster 100 may be attached to/detached from the rear surface of the main housing 20 by at least one heat-collection mediating fixing part 27 that collects heat from the first heating elements P and the second heating elements S and transfers the collected heat to the U-shaped heat dissipation cluster 100 while mediating the attachment/detachment of the U-shaped heat dissipation cluster 100 to/from the rear surface of the main housing 20. The main housing 20 may have a plurality of exposure holes (not illustrated) formed at the rear surface thereof, such that the first heating elements P and the second heating elements S are exposed to the rear side thereof.

However, the plurality of exposure holes do not need to be necessarily formed. Since the main housing 20 is made of a metallic material with thermal conductivity, the first heating elements P and the second heating elements S may be directly brought into thermal contact with the inner surface of the main housing 20.

That is, referring to FIG. 4, the plurality of first heating elements P and the plurality of second heating elements S may be mounted and arranged on the rear surface of the second board 21 so as to protrude to the rear side, and the plurality of thermal contact parts 29 may be formed on the inner surface of the main housing 20 at positions corresponding to the mounting positions of the first and second heating elements P and S so as to protrude to the front side. The plurality of thermal contact parts 29 may be directly brought into thermal contact with the rear surfaces of the first and second heating elements P and S, respectively, and may be formed as one body with the main housing 20. Therefore, the heats generated from the first heating elements P and the second heating elements S may be conducted through the direct thermal contact with the thermal contact parts 29, and actively dissipated to the rear side through the U-shaped heat dissipation cluster 100 installed on the rear side of the main housing 20, while very high heat dissipation performance is maintained. This process will be described below in more detail.

As illustrated in FIG. 3, the antenna device 1 in accordance with the embodiment of the present disclosure may further include the intermediate heat dissipation cluster 240 that is disposed on the rear surface of the first board 23, corresponding to the rear side of the main housing 20, and dissipates heat to the outside, the heat being generated from the third heating elements F provided as FPGA (Field Programmable Gate Array) elements having a higher heating value than the first heating elements P and the second heating elements S.

Figure 5A:
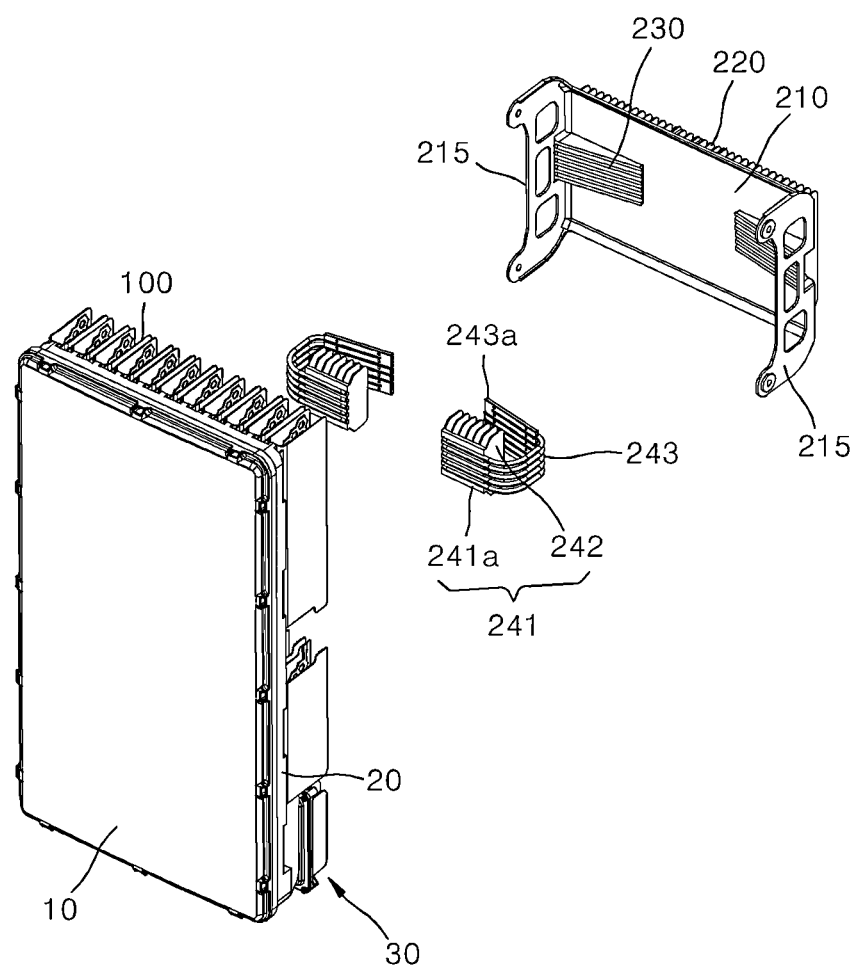
FIGS. 5A and 5B are front-side and rear-side exploded perspective views illustrating that an intermediate heat dissipation cluster among the components of FIG. 2 is installed on the rear surface of the main housing.
Figure 5B:
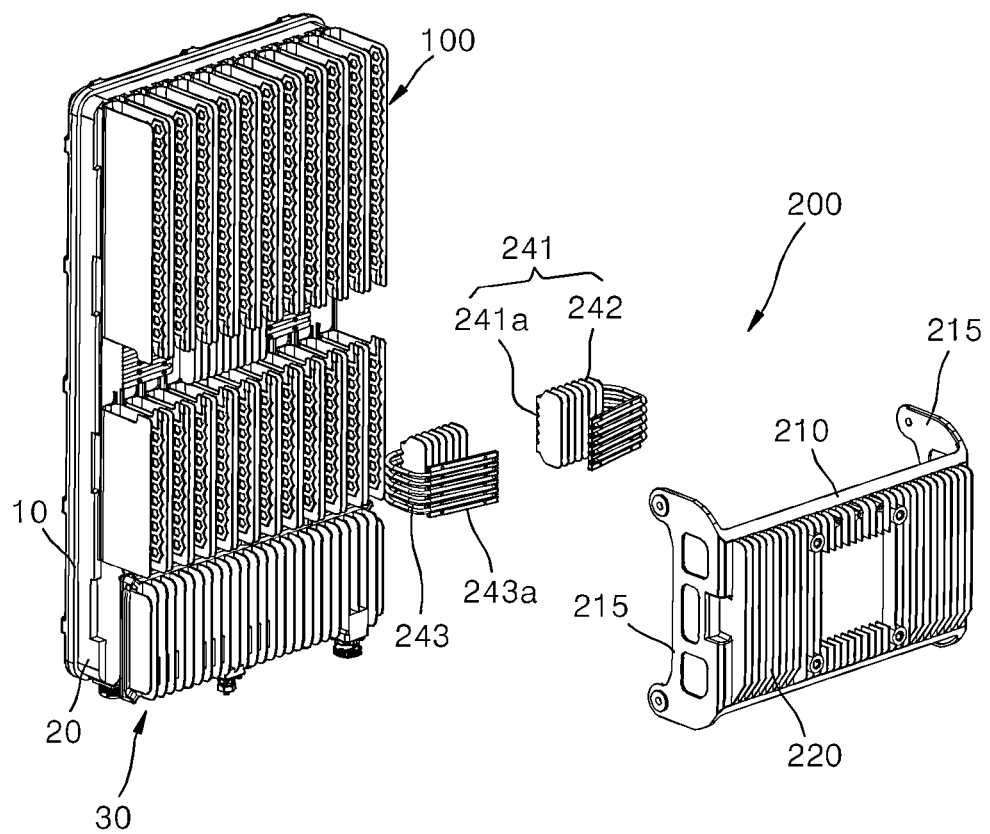

FIGS. 5A and 5B are front-side and rear-side exploded perspective views illustrating that the intermediate heat dissipation cluster among the components of FIG. 2 is installed on the rear surface of the main housing.

The antenna device 1 in accordance with the embodiment of the present disclosure further includes the intermediate heat dissipation cluster 240 for dedicatedly dissipating heat from the third heating elements F, in addition to the U-shaped heat dissipation cluster 100. That is, the antenna device 1 in accordance with the embodiment of the present disclosure can sufficiently dissipate heat, generated from the third heating elements F, to the rear side of the main housing 20 through the U-shaped heat dissipation cluster 100. However, in order to prevent the degradation in heat dissipation performance by non-uniform heat generated from the main housing 20, the antenna device 1 includes the intermediate heat dissipation cluster 240 to dedicatedly dissipate only the heat generated from the third heating elements F to the rear side thereof.

As illustrated in FIGS. 5A and 5B, the intermediate heat dissipation cluster 240 may include a heat collection part 241 and a heat transfer part 243. The heat collection part 241 is installed at the heating portion of each of the third heating elements F, and serves to absorb and collect heat from the third heating element F, and the heat transfer part 243 has one end brought into thermal contact with the heat collection part 241 and the other end brought into thermal contact with a mounting heat dissipation part 210 provided at the rear thereof.

The heat transfer part 243 may include a plurality of heat pipes. The heat pipe is a kind of closed heat exchanger which is filled with a refrigerant, and repeatedly conducts the following process. When a predetermined amount of heat is supplied from one side of the heat pipe, the refrigerant stored therein evaporates and moves to the other side thereof. Then, the refrigerant liquefies at the other side while the heat is dissipated, and then moves to the one side again and evaporates at the one side. That is, independently of the above-described U-shaped heat dissipation cluster 100, the intermediate heat dissipation cluster 240 receives heat from the heating portion of each of the third heating elements F having a higher heating value than the first and second heating elements P and S, and dissipates the heat to the rear side of the main housing 20.

As illustrated in FIGS. 5A and 5B, the heat collection part 241 serves to not only bring one end of the heat transfer part 243 provided as the plurality of heat pipes into thermal contact with a pipe housing part (with no reference numerals) formed as a plurality of grooves at the rear surface of the main housing 20, but also primarily dissipate the heat transferred through the one end of the heat transfer part 243.

For this operation, the heat collection part 241 may include a front coupling plate 241a for closely coupling the one end of the heat transfer part 243 provided as the plurality of heat pipes to the pipe housing part, and a plurality of intermediate heat dissipation pins 242 extended rearward from the front coupling plate 241a by a predetermined length and arranged vertically in a top-to-bottom direction. The intermediate heat dissipation pins 242 are disposed between one end (front end) and the other end (rear end) of the heat transfer part 243, and serve to directly dissipate heat, transferred through the front coupling plate 241a, to the outside.

Although not illustrated in the drawings, the mounting heat dissipation part 210 serves to mediate the coupling of the antenna device 1 to a clamping mechanism for the antenna device 1, which is connected to a pillar pole. More specifically, the mounting heat dissipation part 210 may include a pair of fixed plates 215 fixed to both sides of the main housing 20 and a mounting heat dissipation pin part 220 configured to connect rear ends of the pair of fixed plates 215 to each other and having a plurality of heat dissipation pins spaced apart from each other in a side-to-side direction.

The other end of the heat transfer part 243 among the components of the intermediate heat dissipation cluster 240 may be connected to a pipe seating part 230 formed on the inside (front side) of the mounting heat dissipation part 210 at the mounting heat dissipation pin part 220, and brought into thermal contact with the pipe seating part 230 through a rear coupling plate 243a. The rear coupling plate 243a serves to closely couple the rear end of the heat transfer part 243 provided as the plurality of heat pipes to the pipe seating part 230, like the above-described front coupling plate 241a. Since the mounting heat dissipation pin part 220 of the mounting heat dissipation part 210 is located further back than the U-shaped heat dissipation cluster 100 on the rear side of the main housing 20, the heat generated from the third heating elements F having a relatively high heating value may be easily dissipated to the outside, while prevented from mixing with the heats generated by the first and second heating elements P and S. Thus, the heat distribution inside the main housing 20 may be uniformized further than when only the U-shaped heat dissipation cluster 100 is provided.

As described above, the U-shaped heat dissipation cluster 100 may include a lower heat dissipation part 120 provided at the bottom of the rear surface of the main housing 20 and an upper heat dissipation part 110 provided at the top of the rear surface of the main housing 20, on the basis of the middle of the rear surface of the main housing 20 having the third heating elements F embedded therein. The reason why the U-shaped heat dissipation cluster 100 is divided into the lower heat dissipation part 120 and the upper heat dissipation part 110 is in order to locate the above-described third heat dissipation elements F in the middle of the first board 23 having the third heating elements F located on the rear side of the main housing 20. When the third heating elements F are located not at the middle of the main housing 20 but at the bottom or top of the main housing 20, the U-shaped heat dissipation cluster 100 are not divided into the lower heat dissipation part 120 and the upper heat dissipation part 110, but may be formed as a single heat dissipation part.

The antenna device 1 in accordance with the embodiment of the present disclosure will be described on the basis of the structure in which the first heating elements P and the second heating elements S are located at portions corresponding to the top and bottom of the rear surface of the main housing 20 except a portion corresponding to the middle of the rear surface, and the third heating elements F are located at the portion corresponding to the middle of the rear surface, as illustrated in FIGS. 5A and 5B.

Furthermore, the following descriptions will be based on the supposition that the first heating elements P have a higher heating value than the second heating elements S, and the plurality of second heating elements S are widely distributed around the first heating elements P1. However, the positions of the first and second heating elements P and S are simply designed to derive experiment results of FIGS. 11 to 16 which will be described below, and the scope of the present disclosure is not limited by the position design.

Figure 6:
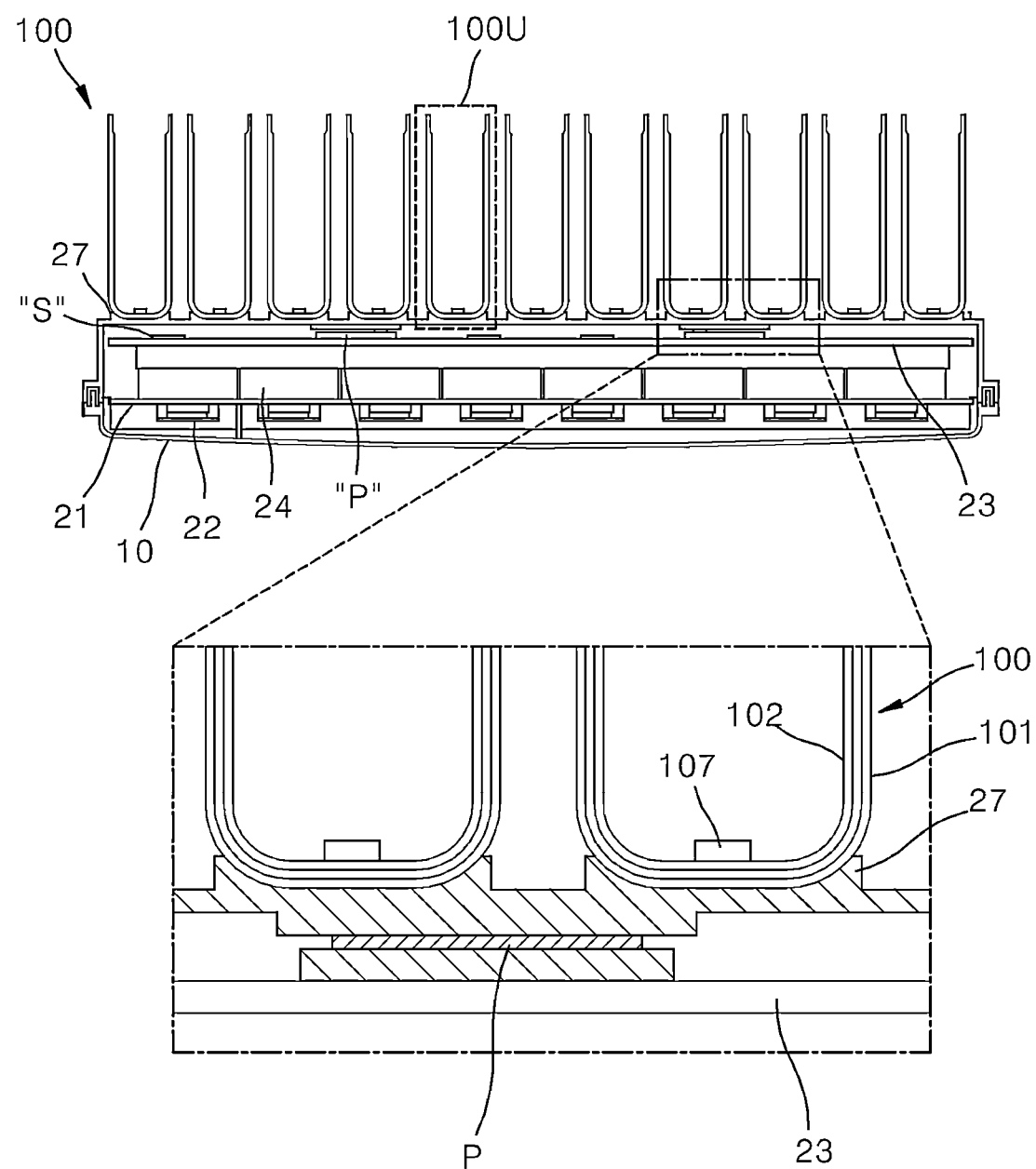
FIG. 6 is a cross-sectional view of the antenna device in accordance with the embodiment of the present disclosure, including an expanded view of a portion thereof.
Figure 7:
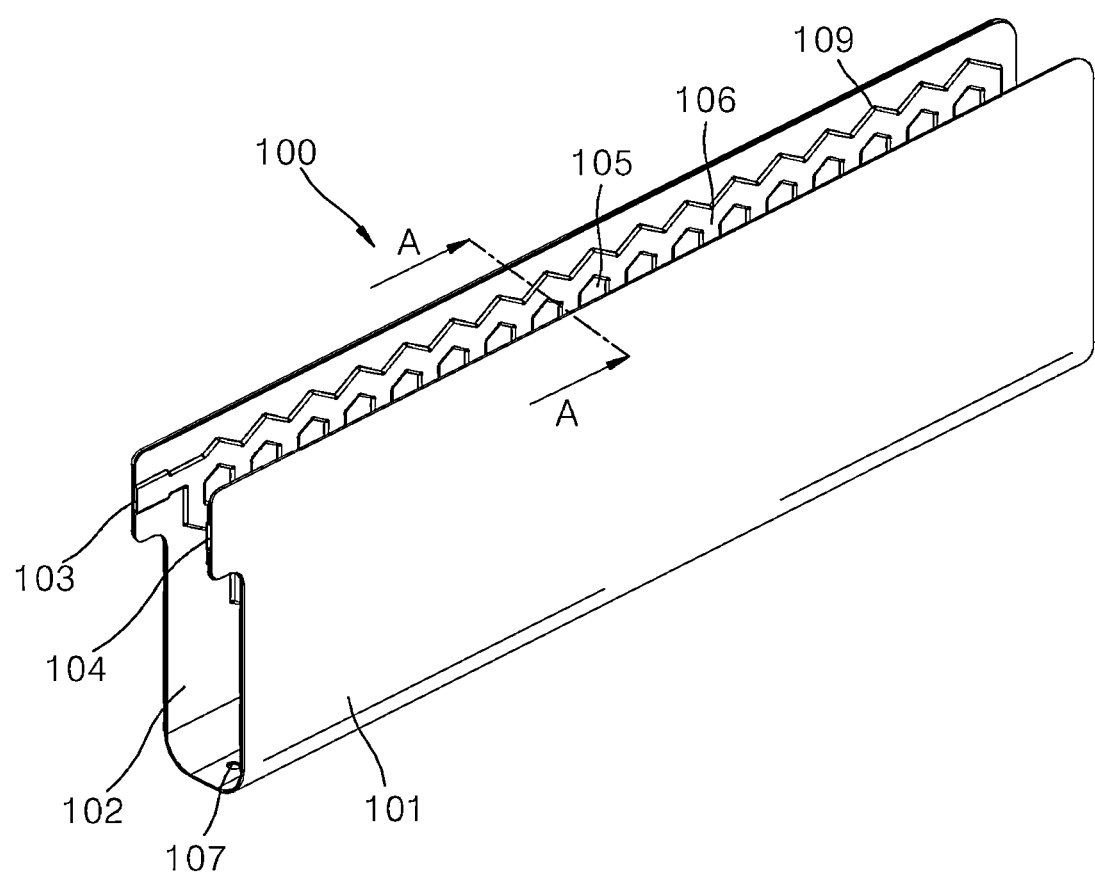
FIG. 7 is a perspective view illustrating a unit heat dissipation body among the components of the antenna device in accordance with the embodiment of the present disclosure.
Figure 8:
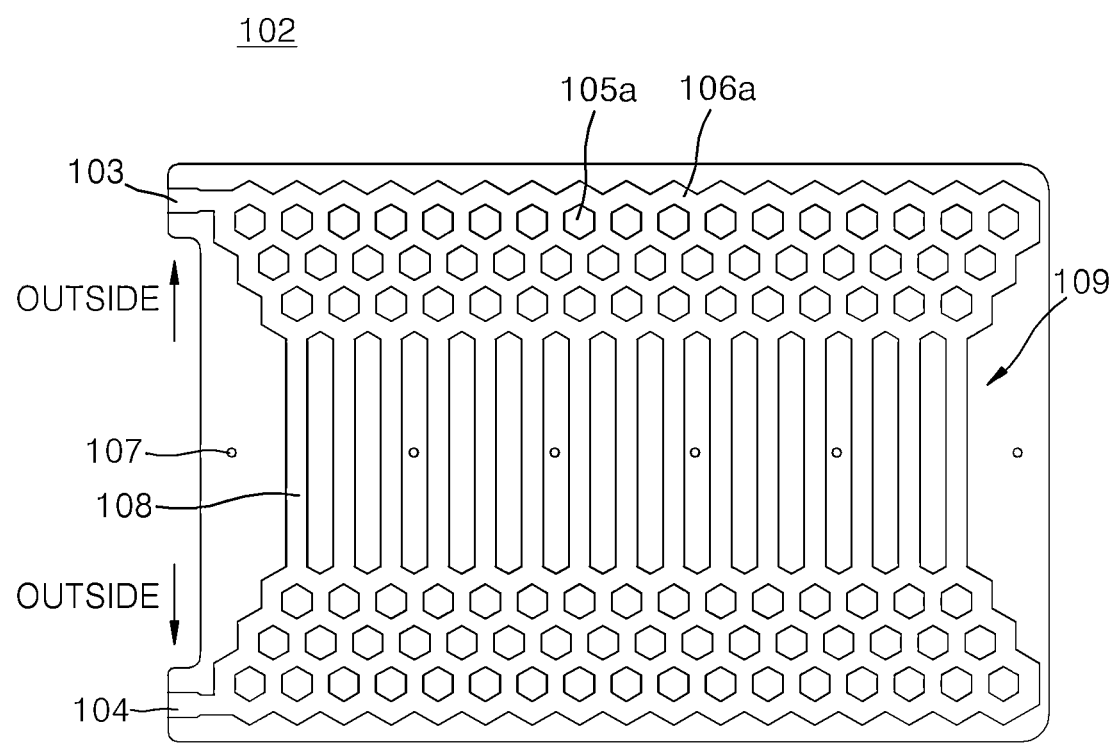
FIG. 8 is an unfolded view illustrating an inner heat dissipation plate among the components of FIG. 7.
Figure 9:
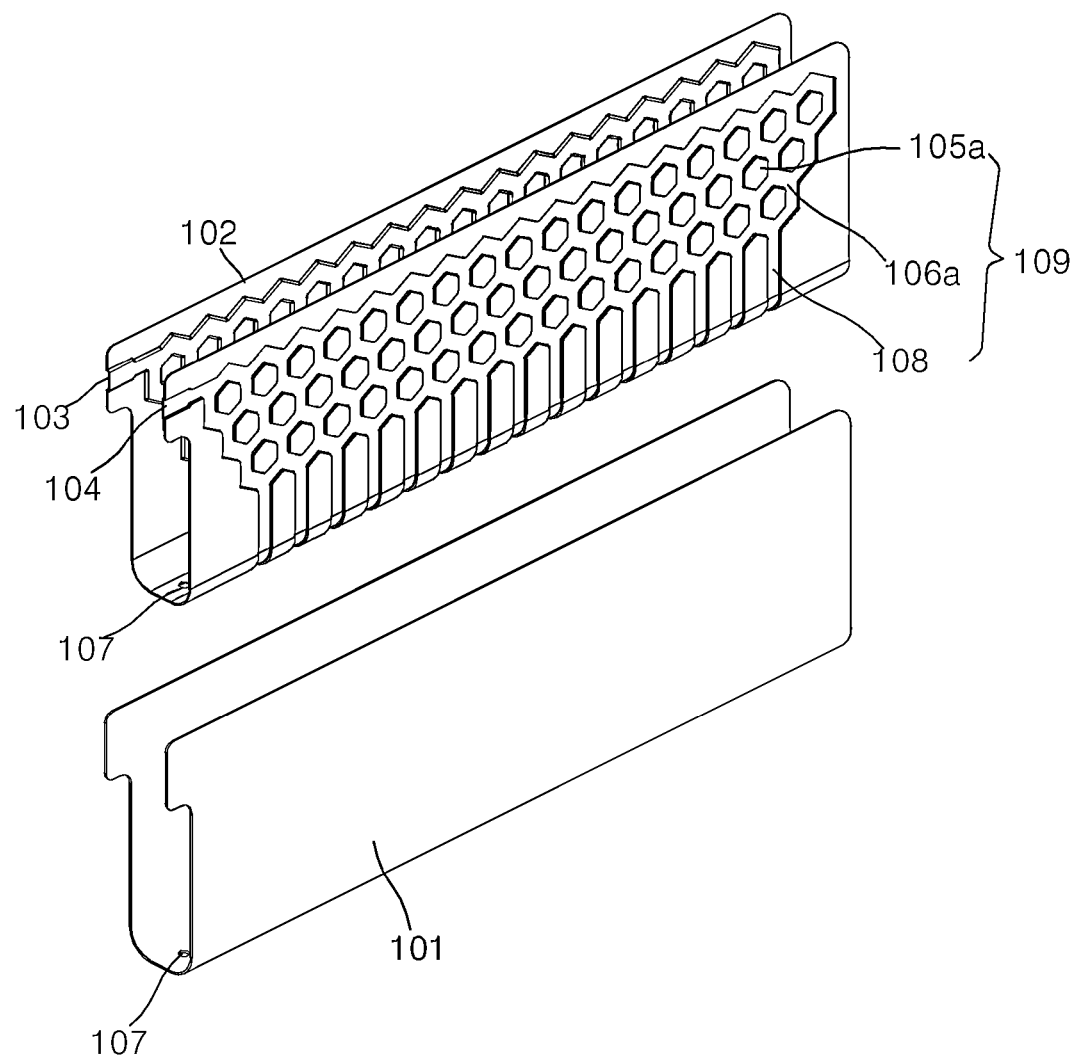
FIG. 9 is an exploded perspective view of FIG. 7.
Figure 10:
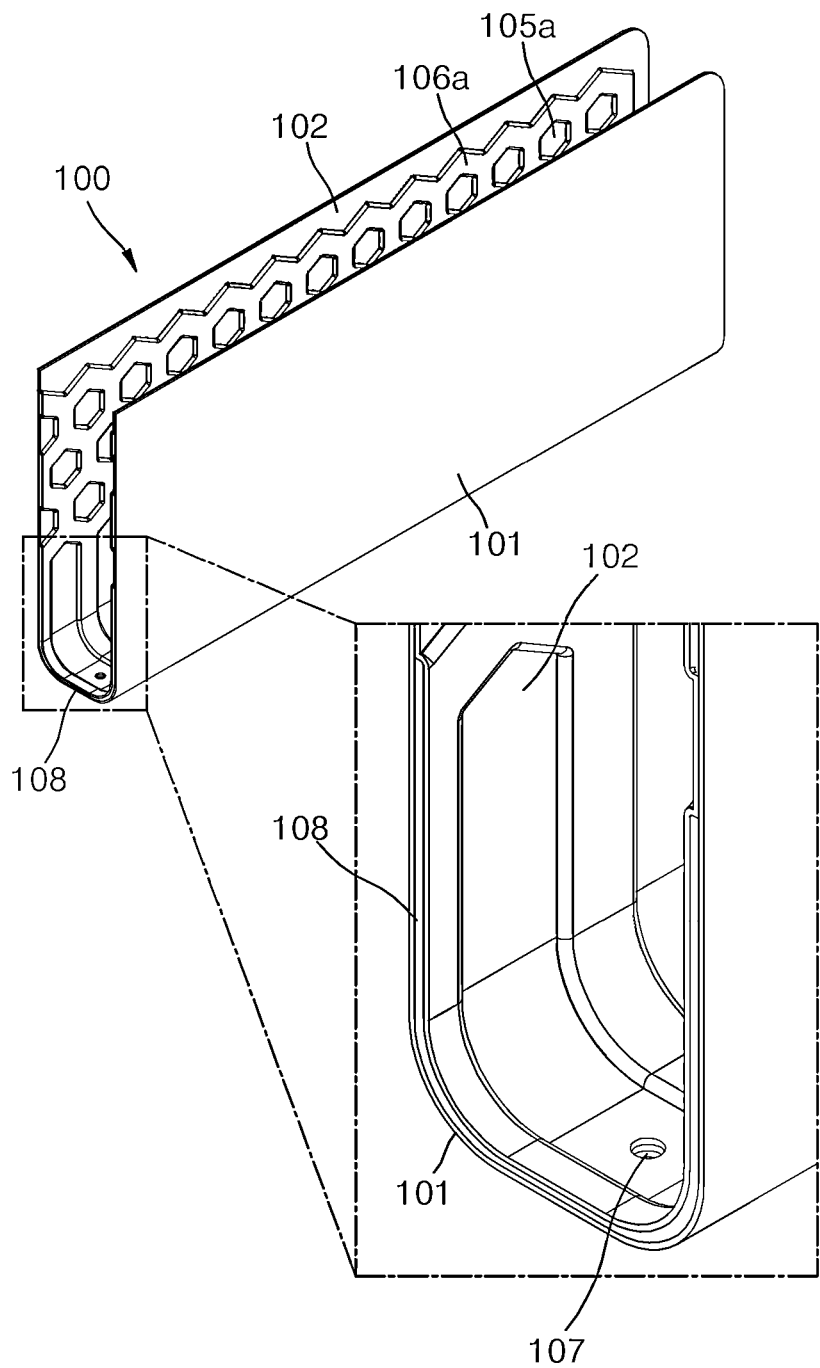
FIG. 10 is a perspective view cut along line A-A of FIG. 7.

FIG. 6 is a cross-sectional view of the antenna device in accordance with the embodiment of the present disclosure, including an expanded view of a portion thereof, FIG. 7 is a perspective view illustrating a unit heat dissipation body among the components of the antenna device in accordance with the embodiment of the present disclosure, FIG. 8 is an unfolded view illustrating an inner heat dissipation plate among the components of FIG. 7, FIG. 9 is an exploded perspective view of FIG. 7, and FIG. 10 is a perspective view cut along line A-A of FIG. 7.

In an embodiment of the antenna device 1 in accordance with the present disclosure, the U-shaped heat dissipation cluster 100 may include a plurality of unit dissipation bodies 100U which are coupled to the rear surface of the main housing 20 so as to be vertically disposed in the longitudinal direction thereof, and spaced by a predetermined distance apart from each other in the side-to-side direction of the main housing 20 so as to have gaps therebetween.

As illustrated in FIGS. 6 to 10, the plurality of unit dissipation bodies 100U may each include an inner heat dissipation plate 102 and an outer heat dissipation plate 101. The inner heat dissipation plate 102 may be bent to have a U-shaped cross-section, and have the pattern flow path 109 engraved therein such that the pattern flow path 109 is filled with a refrigerant, and the outer heat dissipation plate 101 may be bent to have a U-shaped cross-section, and joined to the outside of the inner heat dissipation plate 102.

More specifically, as illustrated in FIG. 6, both ends of the U-shaped unit heat dissipation body 100U form an opening toward the rear side (top side in FIG. 6) from the rear surface of the main housing 20, and a connection portion of the U-shaped unit heat dissipation body 100U may be attached/detached so as to be mated with the heat-collection mediating fixing part 27 provided on the rear surface side of the main housing 20. For this structure, the heat-collection mediating fixing part 27 may be processed in advance in a shape with which the outer surface of a U-shaped bent portion of the outer heat dissipation plate 101 comes in complete contact.

Therefore, the connection portion of the U-shaped unit heat dissipation body 100U functions to collect heat from the first or second heating elements P or S through indirect thermal contact by the medium of the main housing 20, and transfer the collected heat (see a heat receiving pattern part 108 which will be described below), and both ends of the U-shaped unit heat dissipation body 100U, which form an opening, function to finally dissipate the heat transferred through the connection portion of the U-shaped unit heat dissipation body 100U (see a heat dissipation pattern part 105 and 106 which will be described below).

In the embodiment of the present disclosure, it has been described that the pattern flow path 109 is engraved on the inside of the inner heat dissipation plate 102 of the unit heat dissipation body 100U, and the outer heat dissipation plate 101 is joined to the outside of the inner heat dissipation plate 102 having the pattern flow path 109 engraved therein. On the contrary, however, the pattern flow path 109 may be engraved on the outside of the outer heat dissipation plate 101, and the inner heat dissipation plate 102 may be joined to the inside of the outer heat dissipation plate 101.

The refrigerant stored in the pattern flow path 109 of the unit heat dissipation body 100U may be a refrigerant similar to the refrigerant stored in the heat pipes serving as the heat transfer part 243 of the above-described intermediate heat dissipation cluster 240. That is, the refrigerant may be a phase-changeable heat transfer medium which may evaporate when receiving a predetermined amount of heat from the heat receiving pattern part 108 after the closed pattern flow path 109 is filled with the medium, and then move toward the heat dissipation pattern part 105 and 106 to dissipate the heat.

The inner heat dissipation plate 102 and the outer heat dissipation plate 101 may be closely joined to each other such that the refrigerant stored in the pattern flow path 109 does not leak. Once the pattern flow path 109 is filled with the refrigerant, the refrigerant can be reused without refill. Furthermore, a driving element such as a compressor for providing a separate driving force is not required in order to induce a phase change of the refrigerant.

As illustrated in FIG. 7, the unit heat dissipation body 100U may have a pair of refrigerant filling ports 103 and 104 formed therein. The pair of refrigerant filling ports 103 and 104 may be connected to the pattern flow path 109 formed between the inner heat dissipation plate 102 and the outer heat dissipation plate 101 such that the pattern flow path 109 can be filled with the refrigerant, and extended by a predetermined length from one ends of the inner heat dissipation plate 102 and the outer heat dissipation plate 101 in the longitudinal direction thereof. The pair of refrigerant filling ports 103 and 104 may be formed in the same manner as the method for forming the above-described pattern flow path 109. After the pattern flow path 109 is filled with the refrigerant, the pair of refrigerant filling ports 103 and 104 may be joined to each other such that the refrigerant does not leak from the pattern flow path 109.

As illustrated in FIGS. 8 and 9, the pattern flow path 109 may include the heat receiving pattern part 108 formed at the connection portion of the U-shaped cross-section of the unit heat dissipation body 100U and configured to receive heat from the heat-collection mediating fixing part 27, and the heat dissipation pattern parts 105 and 106 formed at both ends of the U-shaped cross-section and configured to communicate with the heat receiving pattern part 108 and dissipate the heat transferred from the heat receiving pattern part 108.

The heat receiving pattern part 108 may be formed as a plurality of straight lines to connect the heat dissipation pattern parts 105 and 106 formed at both ends of the U-shaped cross-section, respectively. Since the heat receiving pattern part 108 is formed along the curved portion of the U-shaped unit heat dissipation body, the heat receiving pattern part 108 may be mated with the heat-collection mediating fixing part 27 to be described below, such that the refrigerant stored in the heat receiving pattern part 108 can easily collect heat and transfer the collected heat.

More specifically, as illustrated in FIGS. 8 and 9, the unit heat dissipation body 100U may be independently fastened to the heat-collection mediating fixing part 27 through fastening members such as fastening screws, such that the portion corresponding to the heat receiving pattern part 108 is mated with the outer surface of the heat-collection mediating fixing part 27. For this structure, the inner and outer heat dissipation plates 102 and 101 of the unit heat dissipation body 100U may have a plurality of screw fastening holes 107 which are formed through the heat receiving pattern part 108 and to which the fastening members are respectively fastened.

The heat dissipation pattern parts 105 and 106 may all communicate with the tip ends of the plurality of heat receiving pattern parts 108 formed as a plurality of straight lines, and each have a heat dissipation area that increases toward the outside. The heat dissipation pattern part 105 and 106 may include a plurality of joining surfaces 105a and a refrigerant flow path 106a. The joining surfaces 105a may be formed in a circular and polygonal shape such that the inner and outer heat dissipation plates 102 and 101 are joined to each other through the joining surfaces 105a, and the refrigerant flow path 106a may be formed so that the inner and outer heat dissipation plates 102 and 101 are spaced apart from each other along the refrigerant flow path 106a, and the refrigerant flows between the joining surfaces 105a or outside the joining surface 105. In the present embodiment, the joining surface 105 is formed in a polygonal shape, for example, a hexagon shape as illustrated in FIGS. 5 to 8. However, the scope of the present disclosure is not limited by the shape.

In the present embodiment, it has been described that the joining surface 105 of the heat dissipation pattern part 105 and 106 has a hexagonal shape. However, the joining surface 105 may be formed in any shapes such as a polygonal shape and circular shape, as long as a temperature condition related to a phase change of the refrigerant stored in the heat dissipation pattern part 105 and 106 is satisfied.

As illustrated in FIG. 10, the heat receiving pattern part 108 is formed to have a minimal gap between the inner heat dissipation plate 102 and the outer heat dissipation plate 101. Thus, when a predetermined amount of heat is transferred, the refrigerant stored in the heat receiving pattern part 108 smoothly evaporates and moves toward the heat dissipation pattern part 105 and 106.

The refrigerant flow path 106a may be formed in such a shape that the refrigerant stored therein can flow without interruption, regardless of the number of the hexagonal joining surfaces 105a. The refrigerant flow path 106a may be formed in such a shape that the length thereof gradually increases from the ends of the heat receiving pattern parts 108 located at the outermost positions of the unit heat dissipation body 100U in the longitudinal direction thereof, respectively, toward the ends of the heat dissipation pattern parts 105 and 106 That is in order to increase a heat transfer area by increasing the area of the refrigerant flow path 106a among the components of the heat dissipation pattern part 105 and 106.

The refrigerant which has evaporated from the heat receiving pattern part 108 and flown to the refrigerant flow path 106a condenses and liquefies while exchanging heat with the external air on the refrigerant flow path 106a, and then moves toward the heat receiving pattern part 108. This process is repeated.

As illustrated in FIG. 6, the U-shaped heat dissipation cluster 100 may be detachably coupled to the rear surface side of the main housing 20 through the heat-collection mediating fixing part 27. The heat-collection mediating fixing part 27 may be formed on the rear side of the main housing 20 so as to be integrated with the main housing 20. Alternatively, the heat-collection mediating fixing part 27 may be separately manufactured and coupled to the rear side of the main housing 20.

As illustrated in FIG. 6, the heat-collection mediating fixing part 27 may have a U-shaped mating groove formed concavely toward the main housing 20, such that a part of the outer surface of the curved portion of the heat receiving pattern part 108 having the U-shaped cross-section is seated in the U-shaped mating groove. Therefore, when a part of the heat receiving pattern part 108 comes into thermal contact through the mating groove, the thermal contact is made across a larger area, which makes it possible to improve the heat transfer rate. The height of the mating groove in which the heat receiving pattern part 108 is seated may be set to various values by experimental data which will be described below. Here, the height indicates the distance from the flat surface of the heat-collection mediating fixing part 27 to the end of the mating groove.

Figure 11A:
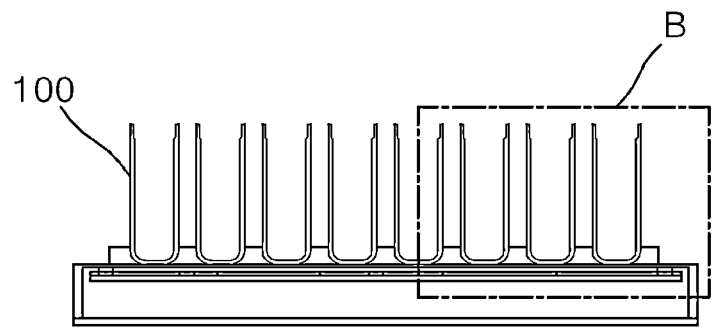
FIGS. 11A and 11B are a cross-sectional view and rear view illustrating the arrangement relationships between a plurality of heating elements and a plurality of U-shaped heat dissipation clusters, in order to prove the effect of the antenna device in accordance with the embodiment of the present disclosure.
Figure 11B:
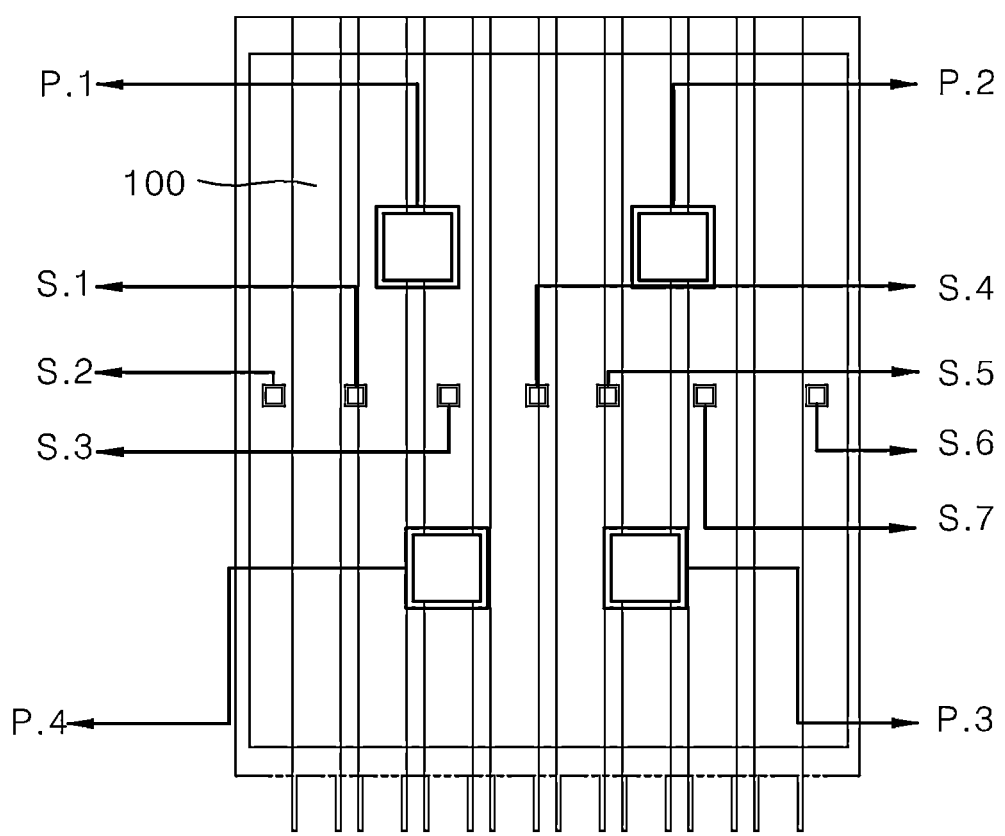
Figure 12:
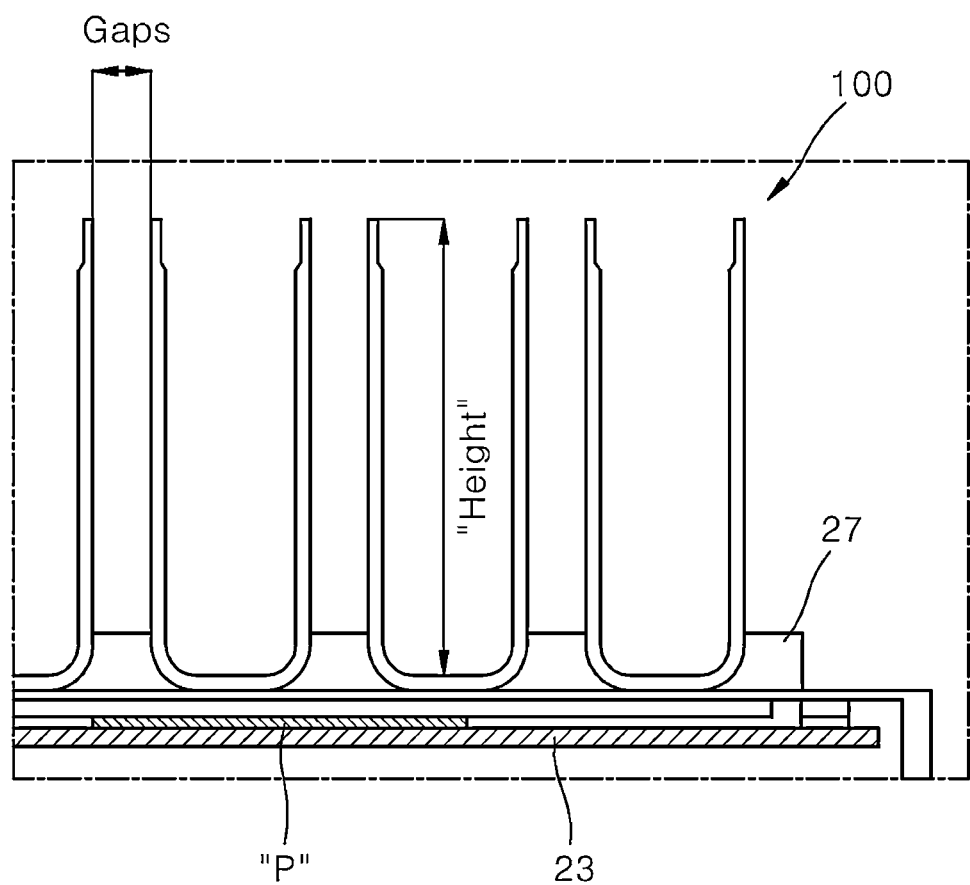
FIG. 12 is an expanded view of a portion "B" in FIG. 11.

FIGS. 11A and 11B are a cross-sectional view and rear view illustrating the arrangement relationships between a plurality of heating elements and a plurality of U-shaped heat dissipation clusters, in order to prove the effect of the antenna device in accordance with the embodiment of the present disclosure, and FIG. 12 is an expanded view of a portion "B" in FIG. 11.

As illustrated in FIGS. 11A and 11B and 12, four first heating elements P are disposed on the rear surface of the first board 23, such that two first heating elements P are located at the top of the rear surface and two first heating elements P are located at the bottom of the rear surface, and seven second heating elements S are disposed between the first heating elements P at the top and the first heating elements P at the bottom, in order to prove the experimental effects by the U-shaped heat dissipation cluster 100 in the antenna device 1 in accordance with the embodiment of the present disclosure. The first heating elements P at the top and the first heating elements P at the bottom are spaced apart by a predetermined distance from each other in the side-to-side direction, and the seven second heating elements S are spaced apart by a predetermined distance from each other in the side-to-side direction.

The distances between the respective unit heat dissipation bodies of the U-shaped heat dissipation cluster 100 are defined as gaps, and the distance from the inner bottom surface of the U-shaped cross-section of the unit heat dissipation body to both ends forming an opening is defined as height. In order to derive the experimental data, a heat flow was observed after a predetermined amount of heat was generated under a natural convection condition of about 45° C.

This is in order to design the optimal values of the gaps between the respective unit dissipation bodies of the U-shaped heat dissipation cluster 100 and the height thereof. However, the present experimental data simply define the relation principle between the gaps and the height, and the present disclosure is not limited by the experimental data. That is because the experimental data may exhibit different result values due to the entire size of the main housing 20, the numbers of the first heating elements P and the second heating elements S, the distance between the first heating elements P, and the distance between the second heating elements S.

Figure 13:
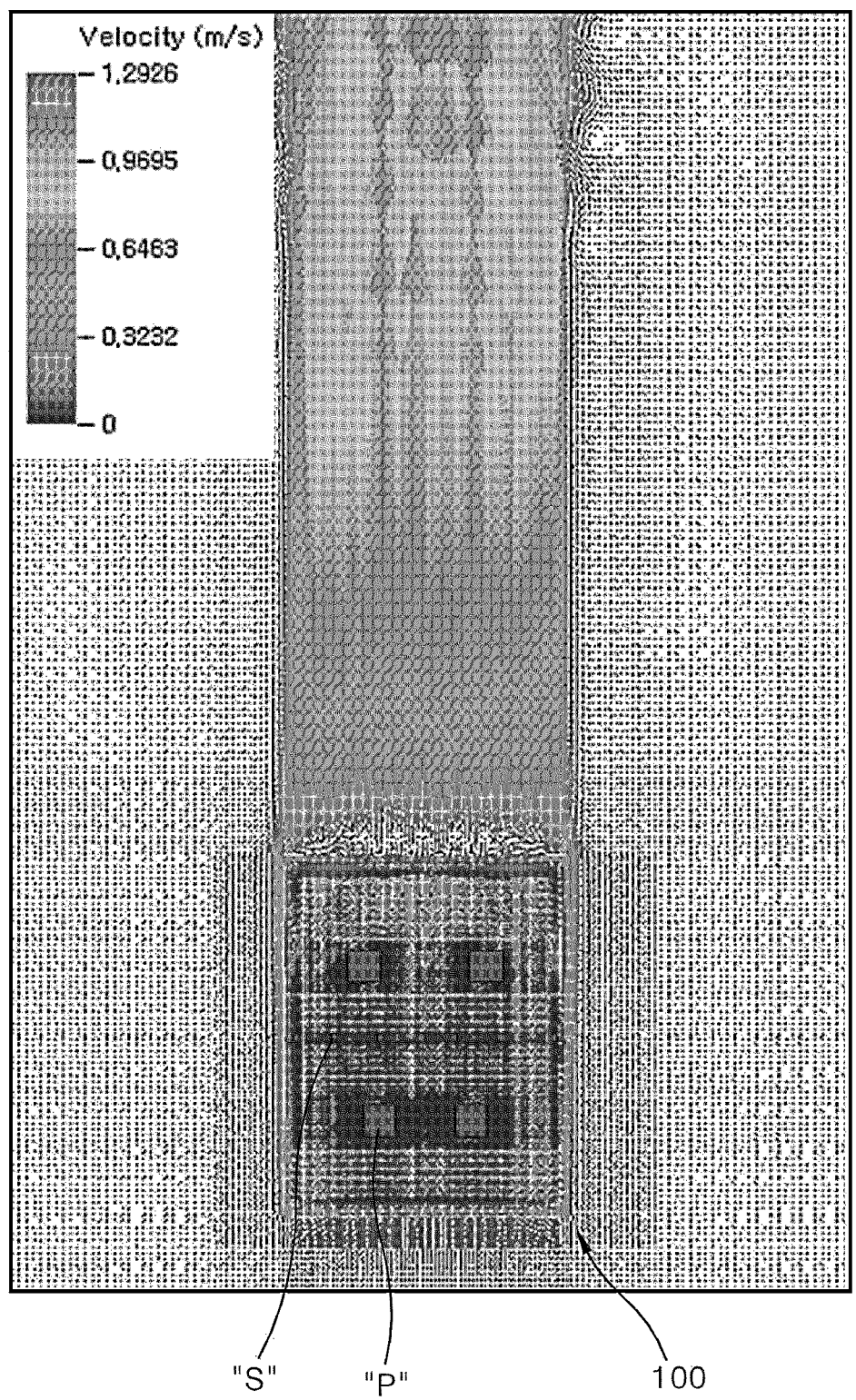
FIG. 13 is a simulation diagram illustrating heat dissipation velocity by a heat-collection mediating fixing part among the components of the antenna device in accordance with the embodiment of the present disclosure.
Figure 14:
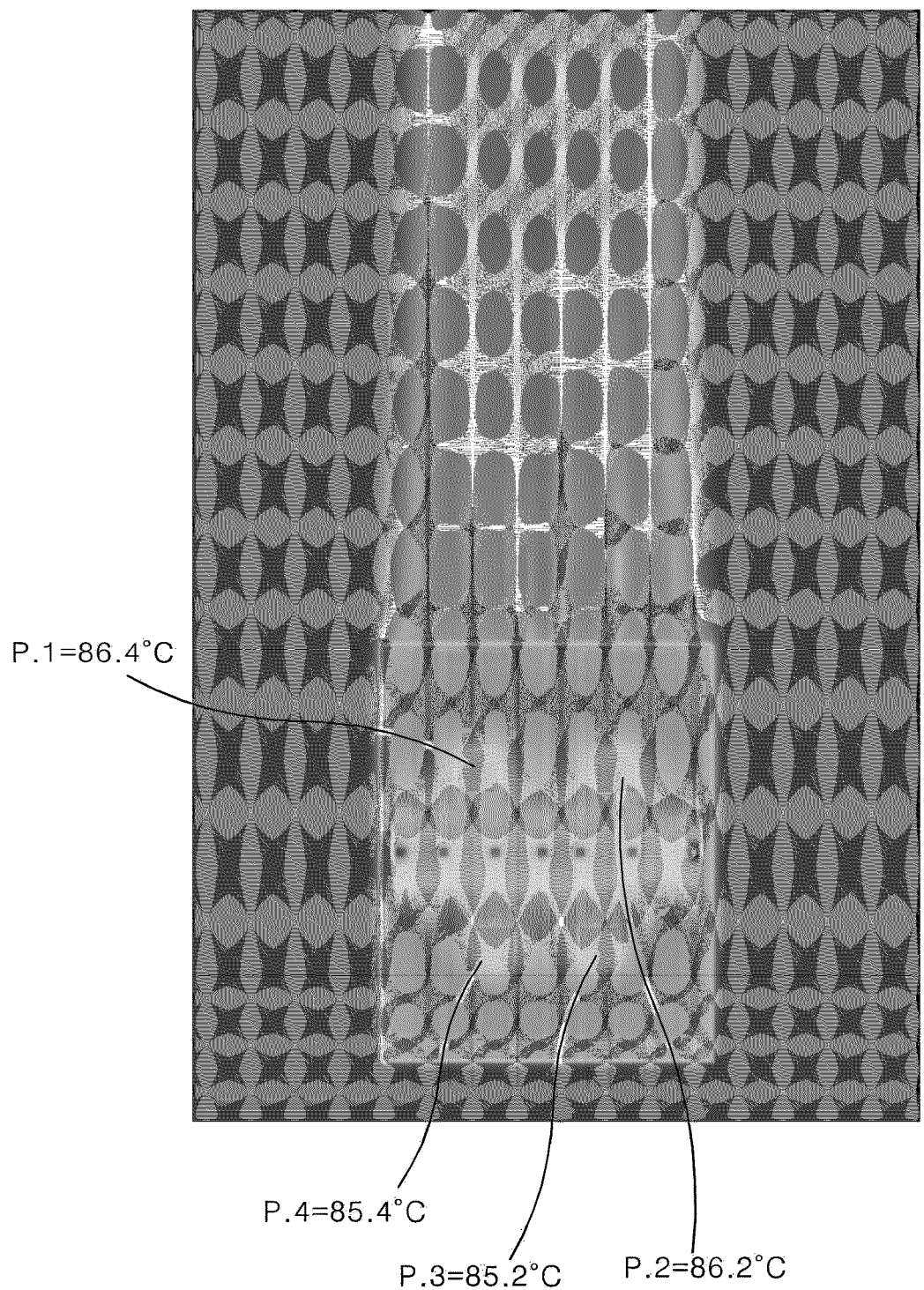
FIG. 14 is a simulation diagram illustrating that heat is transferred by the heat-collection mediating fixing part among the components of the antenna device in accordance with the embodiment of the present disclosure.
Figure 15:
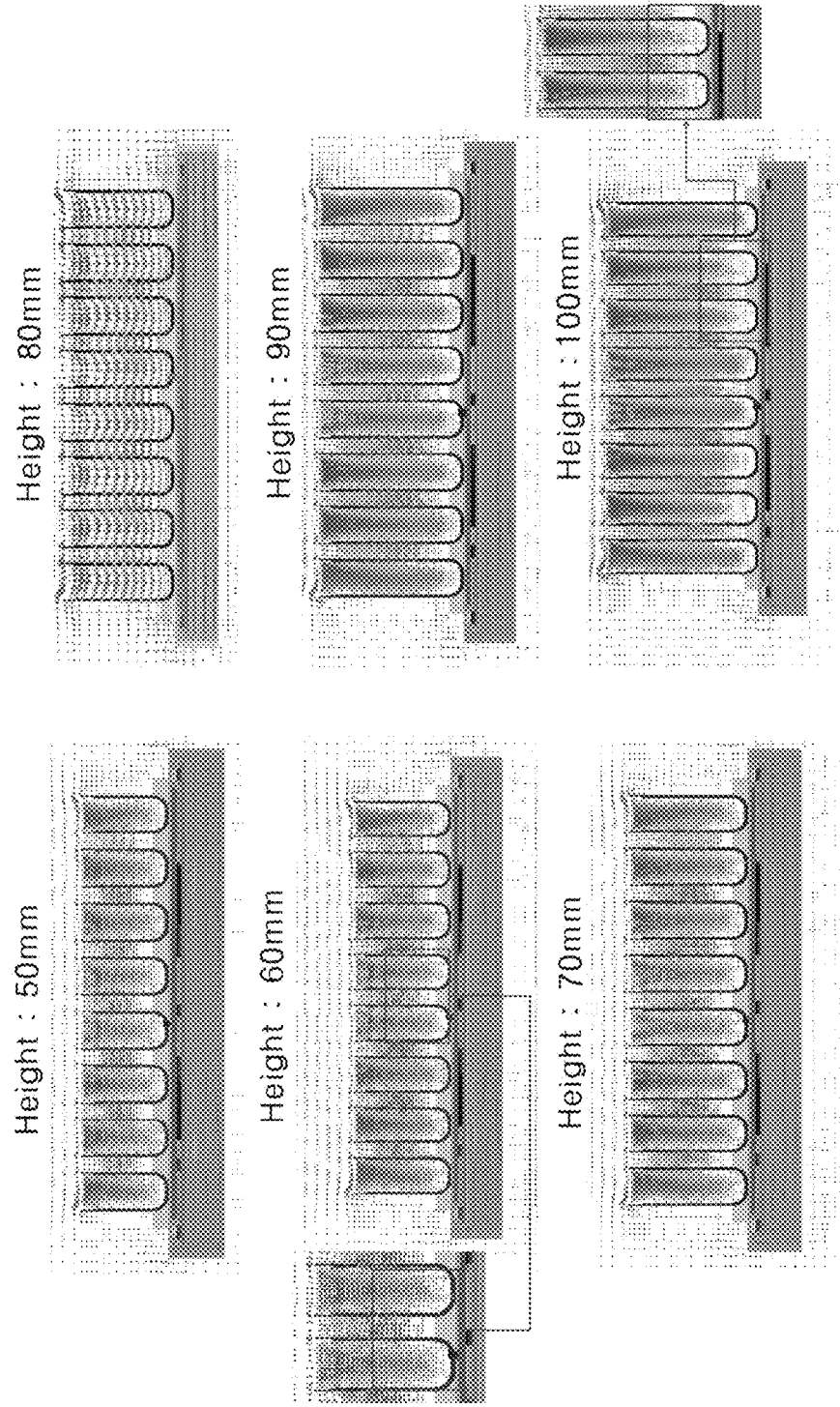
FIG. 15 is a diagram illustrating a heat transfer simulation for designing the optimal height of the unit heat dissipation body among the components of the antenna device in accordance with the embodiment of the present disclosure.
Figure 16:
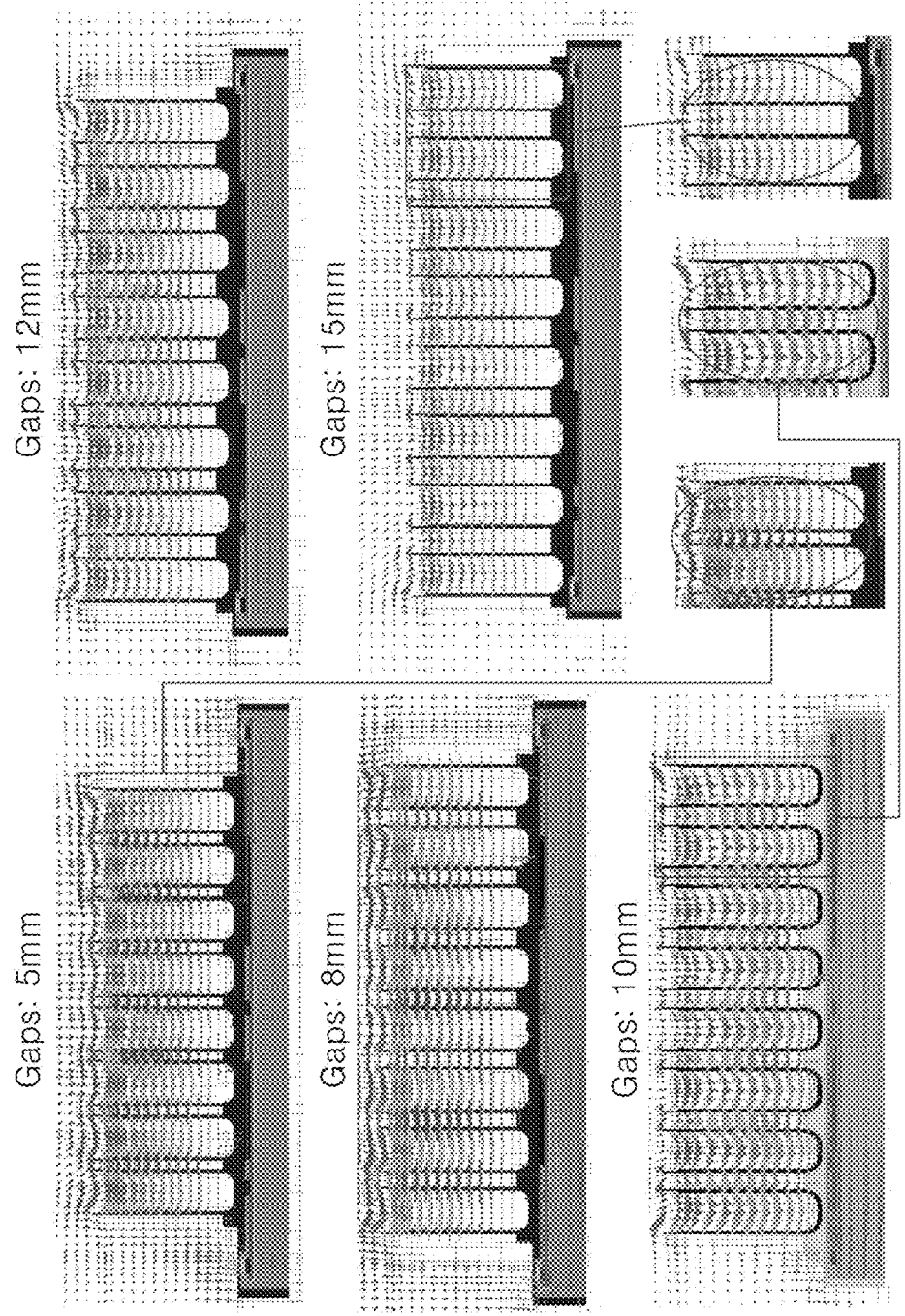
FIG. 16 is a diagram illustrating a heat transfer simulation for designing the optimal gaps between the unit heat dissipation bodies among the components of the antenna device in accordance with the embodiment of the present disclosure.

FIG. 13 is a simulation diagram illustrating heat dissipation velocity by the heat-collection mediating fixing part among the components of the antenna device in accordance with the embodiment of the present disclosure, FIG. 14 is a simulation diagram illustrating that heat is transferred by the heat-collection mediating fixing part among the components of the antenna device in accordance with the embodiment of the present disclosure, FIG. 15 is a diagram illustrating a heat transfer simulation for designing the optimal height of the unit heat dissipation body among the components of the antenna device in accordance with the embodiment of the present disclosure, and FIG. 16 is a diagram illustrating a heat transfer simulation for designing the optimal gaps between the unit heat dissipation bodies among the components of the antenna device in accordance with the embodiment of the present disclosure.

FIG. 13 shows that heat flows around the first and second heating elements P and S provided with the U-shaped heat dissipation cluster 100 have a very uniform heat flow velocity. Therefore, it could be confirmed that, even when heating parts such as the third heating elements are present around the first and second heating elements P and S, the first and second heating elements P and S are not separately influenced by the heating parts.

FIG. 14 and Table 1 below show the difference between the case in which the heat-collection mediating fixing part 27 is provided and the case in which the heat-collection mediating fixing part 27 is not provided. That is, when the heat-collection mediating fixing part 27 is provided, a temperature difference ranging approximately from −0.4° C. to −3.4° C. occurs, compared to when the heat-collection mediating fixing part 27 is not provided. This index indicates that, with the heat-collection mediating fixing part 27 provided to secure a larger heat transfer area, heat can be uniformly transferred to the plurality of unit heat dissipation bodies, which makes it possible to improve the heat dissipation performance.

TABLE 1

| | | Temperature measurement value [° C.] | | |
|---|---|---|---|---|
| | Heating element No. | Heat-collection mediating fixing part (27) X | Heat-collection mediating fixing part (27) O | Temperature difference ΔT [° C.] |
| 1 | P.1 | 89.6 | 86.4 | −3.2 |
| 2 | P.2 | 89.4 | 86.2 | −3.2 |
| 3 | P.3 | 88.6 | 85.2 | −3.4 |
| 4 | P.4 | 88.8 | 85.4 | −3.4 |
| 5 | S.1 | 105.0 | 104.2 | −0.8 |
| 6 | S.2 | 105.7 | 104.5 | −1.2 |

TABLE 1-continued

| | | Temperature measurement value [° C.] | | |
|---|---|---|---|---|
| | Heating element No. | Heat-collection mediating fixing part (27) X | Heat-collection mediating fixing part (27) O | Temperature difference ΔT [° C.] |
| 7 | S.3 | 106.3 | 104.9 | −1.4 |
| 8 | S.4 | 106.3 | 104.3 | −2 |
| 9 | S.5 | 104.5 | 104.1 | −0.4 |
| 10 | S.6 | 107.7 | 106.5 | −1.2 |
| 11 | S.7 | 109.2 | 107.6 | −1.6 |

FIG. 15 shows through simulation values that, when the height of the unit heat dissipation body 100U is equal to or greater than 70 mm and equal to or smaller than 90 mm, thermal interference does not occur, and heat dissipation is normally performed. For example, when the height of the unit heat dissipation body 100U is 60 mm and the height of the unit heat dissipation body 100U is 100 mm or higher, thermal interference between the unit heat dissipation body 100U and a neighboring unit heat dissipation body occurs to degrade the heat dissipation performance, as illustrated in FIG. 15. FIG. 16 shows that, when the gaps between the unit heat dissipation bodies 100U are equal to or greater than 8 mm and equal to or smaller than 12 mm, thermal interference does not occur therebetween. That is, when the gaps between the unit heat dissipation bodies 100U are equal to or smaller than 5 mm and the gaps are equal to or greater than 15 mm, thermal interference occurs therebetween as illustrated in FIG. 16, which degrades the heat dissipation performance.

However, such experimental data only provide different design indexes depending on the specifications of manufactured antenna devices 1, and have significance in showing that a difference in heat dissipation performance occurs depending on the gaps and the height between the unit heat dissipation bodies 100U. Due to the design errors of the gap and the height between the unit heat dissipation bodies 100U, an ascending air current of heat generated from the plurality of first to third heating elements P, S, and F of the antenna device 1 elongated in the top-to-bottom direction may cause heat concentration on a predetermined portion. Thus, the antenna device 1 in accordance with the embodiment of the present disclosure may prevent the heat concentration in advance, thereby preventing the degradation in heat dissipation performance.

In the antenna device 1 in accordance with the embodiment of the present disclosure, the gaps between the unit heating dissipation bodies 100U and the height thereof may be set according to the optimal design for preventing the thermal interference therebetween. Thus, it is possible to not only improve the heat dissipation performance of the antenna device 1, but also minimize the influence by the ascending air current of heat generated by the part elements such as the third heating elements F, which have a higher heating value than the first and second heating elements P and S therearound So far, the antenna device in accordance with the embodiment of the present disclosure has been described in detail with reference to the accompanying drawings. However, it is obvious that the present disclosure is not limited by the above-described embodiments, but may be carried out in various modification and equivalent ranges by those skilled in the art to which the present disclosure pertains. Thus, the true scope of the present disclosure is defined by the following claims.

INDUSTRIAL APPLICABILITY

The present disclosure provides an antenna device which can effectively dissipate heat through U-shaped heat dissipation clusters and intermediate heat dissipation clusters, which are independently provided for heating elements, and minimize heat concentration by an ascending air current of heat on the rear surface of a main housing which is elongated in a top-to-bottom direction, thereby preventing the degradation in performance of parts.

The invention claimed is:

1. An antenna device comprising:
a main housing configured to house and fix a first board having a plurality of heaters mounted on a rear surface thereof;
at least one U-shaped heat dissipation cluster detachably coupled to the rear surface of the main housing, and filled with a predetermined refrigerant, wherein the refrigerant receives heat from the heaters and dissipates the heat to the outside while moving along a pattern flow path formed in a distributed manner toward the outside; and
at least one heat-collection mediating fixing part configured to collect heat from the heaters and transfer the collected heat to the U-shaped heat dissipation cluster, while mediating the attachment/detachment of the U-shaped heat dissipation cluster to/from the rear surface of the main housing,
wherein the U-shaped heat dissipation cluster comprises:
a lower heat dissipation part provided at the bottom of the rear surface of the main housing; and
an upper heat dissipation part provided at the top of the rear surface of the main housing, and
the antenna device further comprises an intermediate heat dissipation cluster configured to dissipate heat generated from a plurality of first heaters mounted on a region of the rear surface of the first board, the region corresponding to the space between the lower heat dissipation part and the upper heat dissipation part.

2. The antenna device of claim 1, wherein the plurality of heaters comprise second heaters and third heaters,
wherein each of the second heaters is a PA (Power Amplifier) element, and each of the third heaters is a semiconductor element for RFIC or an LNA (Low Noise Amplifier) element.

3. The antenna device of claim 1, wherein the intermediate heat dissipation cluster comprises:
a heat collection part installed at a heating portion of each of the first heaters and configured to absorb and collect heat from the first heaters; and
a heat transfer part provided as a heat pipe having one end brought into thermal contact with the heat collection part and the other end brought into thermal contact with a mounting heat dissipation part provided on the rear side of the main housing.

4. The antenna device of claim 1, wherein the plurality of first heaters have a higher heating value than the plurality of heaters.

5. An antenna device comprising:
a main housing configured to house and fix a first board having a plurality of heaters mounted on a rear surface thereof;
at least one U-shaped heat dissipation cluster detachably coupled to the rear surface of the main housing, and filled with a predetermined refrigerant, wherein the refrigerant receives heat from the heaters and dissipates the heat to the outside while moving along a pattern flow path formed in a distributed manner toward the outside; and
at least one heat-collection mediating fixing part configured to collect heat from the heaters and transfer the collected heat to the U-shaped heat dissipation cluster, while mediating the attachment/detachment of the U-shaped heat dissipation cluster to/from the rear surface of the main housing,
wherein the U-shaped heat dissipation cluster comprises:
an inner heat dissipation plate bent to have a U-shaped cross-section, and having the pattern flow path engraved therein such that the pattern flow path is filled with the refrigerant; and
an outer heat dissipation plate bent to have a U-shaped cross-section, and joined to the outside of the inner heat dissipation plate,
wherein the pattern flow path comprises:
a heat receiving pattern part provided at a connection portion of the U-shaped cross-section, and configured to receive heat from the heat-collection mediating fixing part; and
a heat dissipation pattern part communicating with the heat receiving pattern part, and formed at either end of the U-shaped cross-section so as to dissipate the heat transferred from the heat receiving pattern part,
wherein the heat receiving pattern part is formed as a plurality of straight lines to connect the heat dissipation pattern parts formed at both ends of the U-shaped cross-section, respectively,
wherein the heat dissipation pattern part communicates with the front ends of the plurality of heat receiving pattern parts formed as the plurality of straight lines, and has a heat dissipation area that increases toward the outside.

6. The antenna device of claim 5, wherein the inner heat dissipation plate and the outer heat dissipation plate are closely joined to each other such that the refrigerant stored in the pattern flow path does not leak.

7. The antenna device of claim 5, wherein the heat dissipation pattern part comprises:
a joining surface formed in a circular or polygonal shape such that the inner heat dissipation plate and the outer heat dissipation plate are joined to each other through the joining surface; and
a refrigerant flow path formed so that the inner heat dissipation plate and the outer heat dissipation plate are spaced apart from each other along the refrigerant flow path, and the refrigerant flows between the joining surfaces or outside the joining surfaces.

8. The antenna device of claim 5, wherein the heat-collection mediating fixing part has a U-shaped mating groove to seat a portion of the heat receiving pattern part.

9. The antenna device of claim 1, wherein the U-shaped heat dissipation cluster comprises a plurality of unit heat dissipation bodies having a U-shaped cross-section with a height and gaps provided to remove thermal interference therebetween.

* * * * *